(12) United States Patent
Ishigaki

(10) Patent No.: US 6,788,070 B2
(45) Date of Patent: Sep. 7, 2004

(54) FAULT TOLERANT SEMICONDUCTOR SYSTEM

(75) Inventor: Takeshi Ishigaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 89 days.

(21) Appl. No.: 10/162,608

(22) Filed: Jun. 6, 2002

(65) Prior Publication Data

US 2003/0197515 A1 Oct. 23, 2003

(30) Foreign Application Priority Data

Apr. 17, 2002 (JP) ........................................ 2002-115210

(51) Int. Cl.[7] .......................... G01R 31/00; G06F 17/50
(52) U.S. Cl. ............................ 324/508; 324/538; 716/4; 716/5
(58) Field of Search .................................. 324/536, 763, 324/158.1, 508, 511, 512, 527, 528, 525, 522, 754–765, 538; 257/775, 786; 716/1, 2, 4, 5

(56) References Cited

U.S. PATENT DOCUMENTS 6,002,267 A * 12/1999 Malhotra et al. ........... 324/765

OTHER PUBLICATIONS

Ronald P. Cenker, et al. "A Fault–Tolerant 64K Dynamic Random–Access Memory", IEEE Transactions on Electron Devices, vol. ED–26, No. 6, Jun. 1979, pp. 853–860.

* cited by examiner

Primary Examiner—N. Le
Assistant Examiner—Donald M. Lair
(74) Attorney, Agent, or Firm—Oblon, Spivak, McClelland, Maier & Neustadt, P.C.

(57) ABSTRACT

A semiconductor system includes a plurality of semiconductor chips, a first group of wirings, a second group of wirings and a connection rearrange wiring section. The first group of wirings interconnect the plurality of semiconductor chips. The second group of wirings are used for redundancy and interconnect the plurality of semiconductor chips. The connection rearrange wiring section includes a connection test circuit and connection rearrange circuit. The connection test circuit makes a test for connection between the plurality of semiconductor chips by means of the first group of wirings. The connection rearrange circuit makes unusable a wiring of the first group in which poor connection occurs and rearranges the connection between the semiconductor chips by use of the wiring of the second group when the poor connection is detected in the wiring of the first group by the connection test circuit.

26 Claims, 24 Drawing Sheets

Fetching of coincidence determination result

Preparation for readout of all of test results

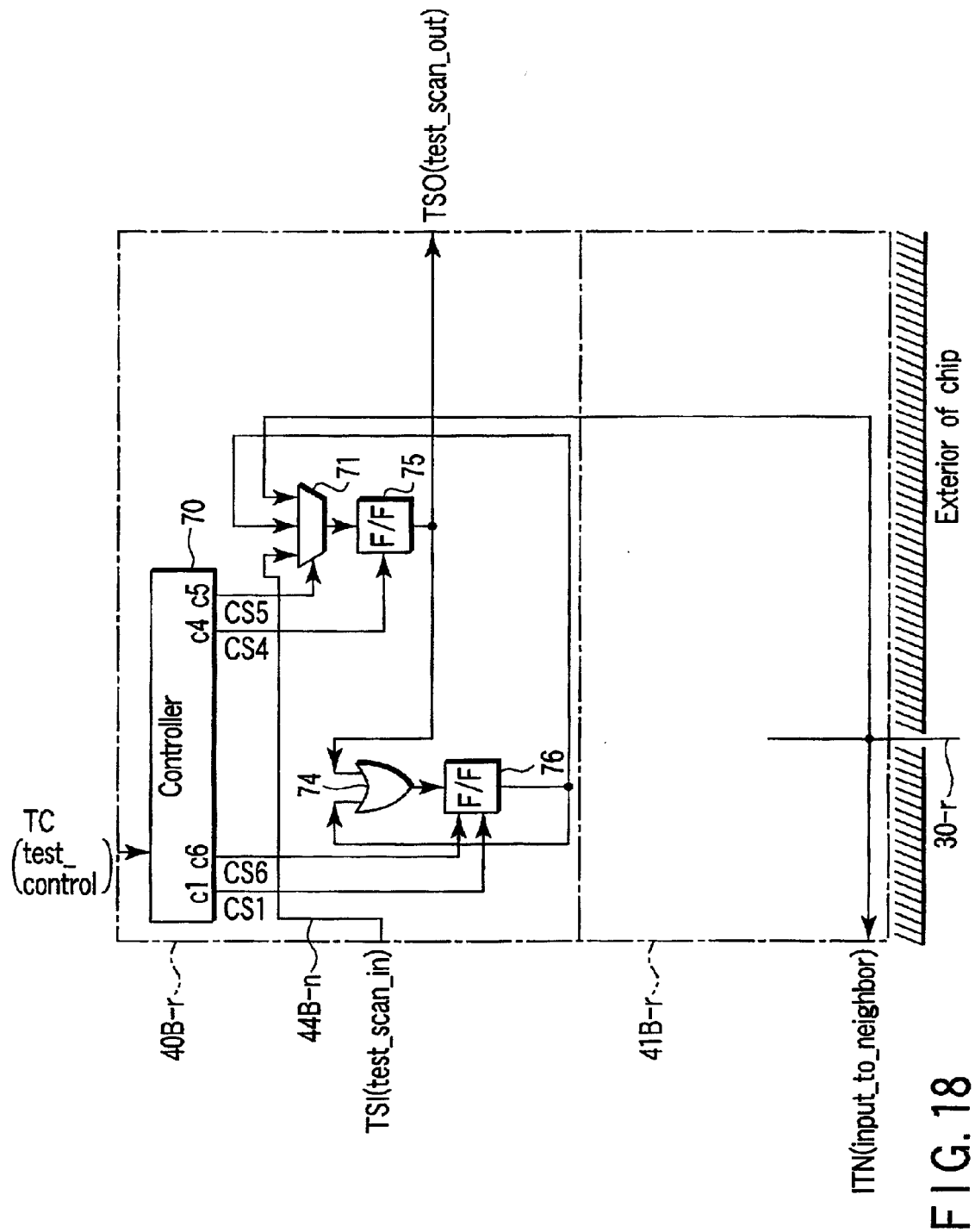
F I G. 18

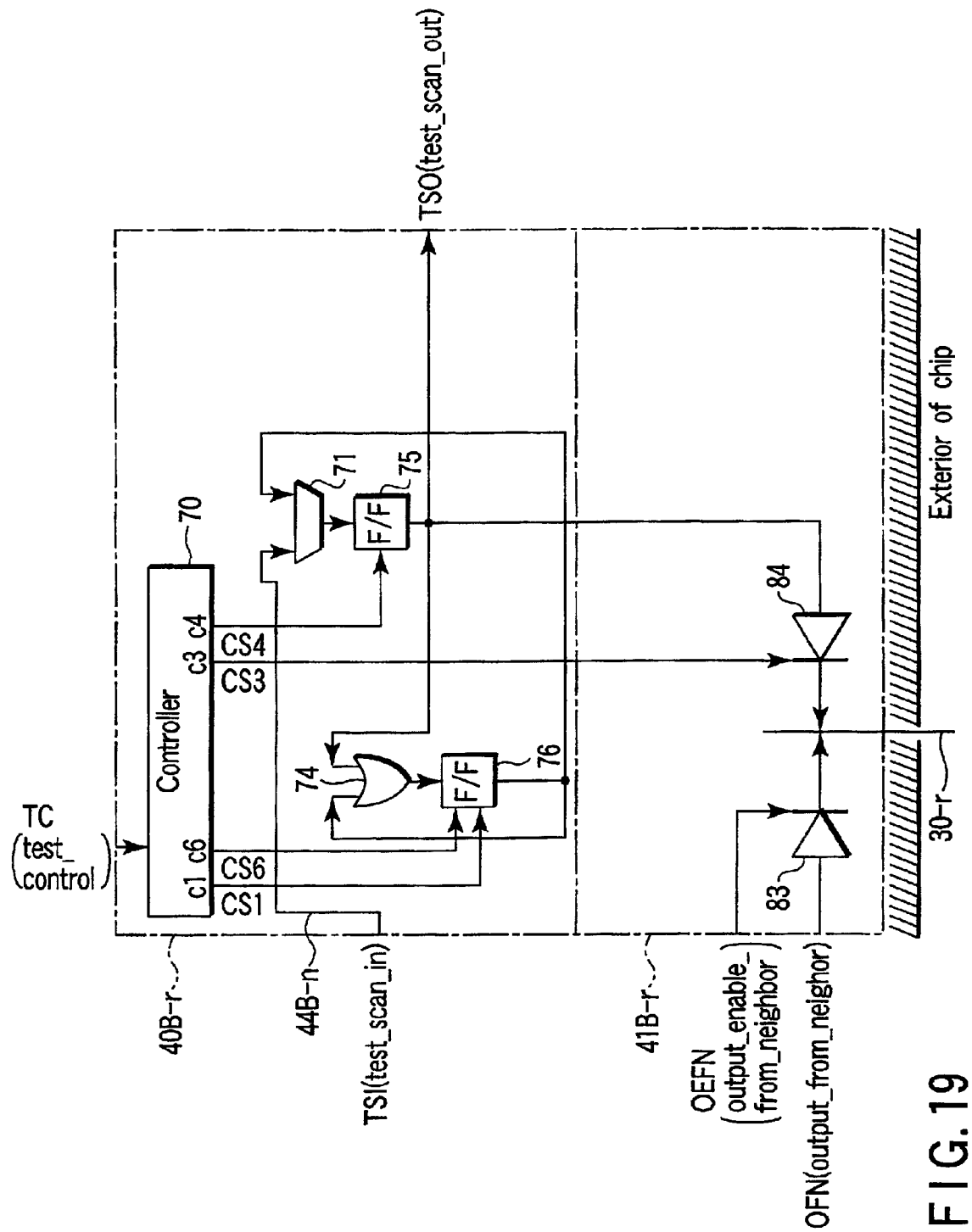
F I G. 19

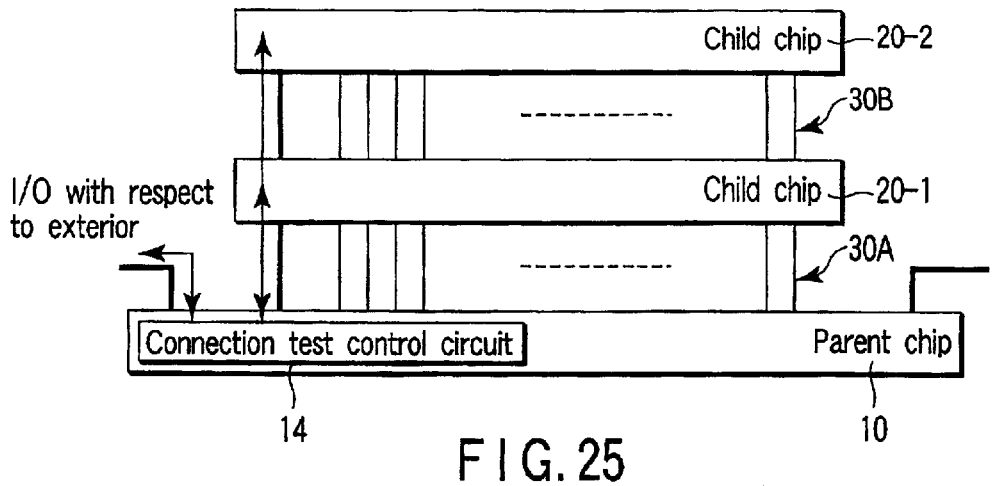
F I G. 25
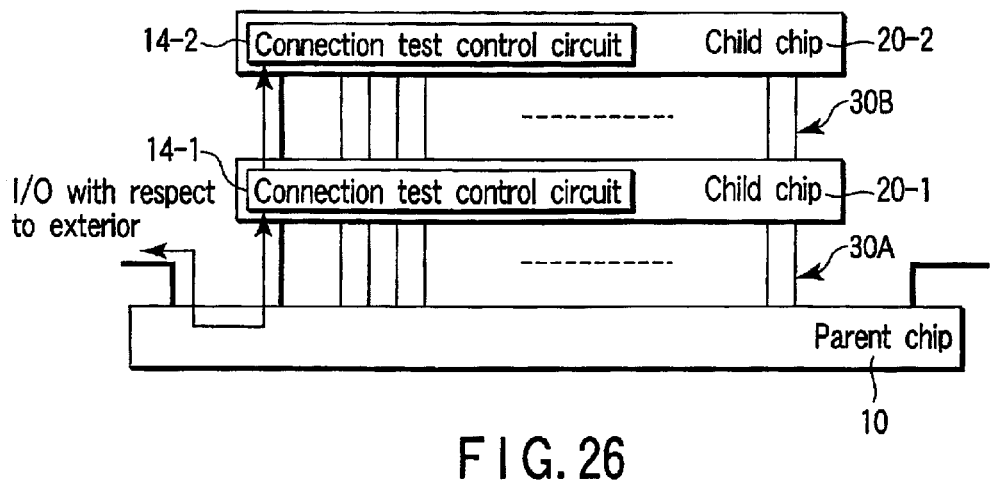
F I G. 26
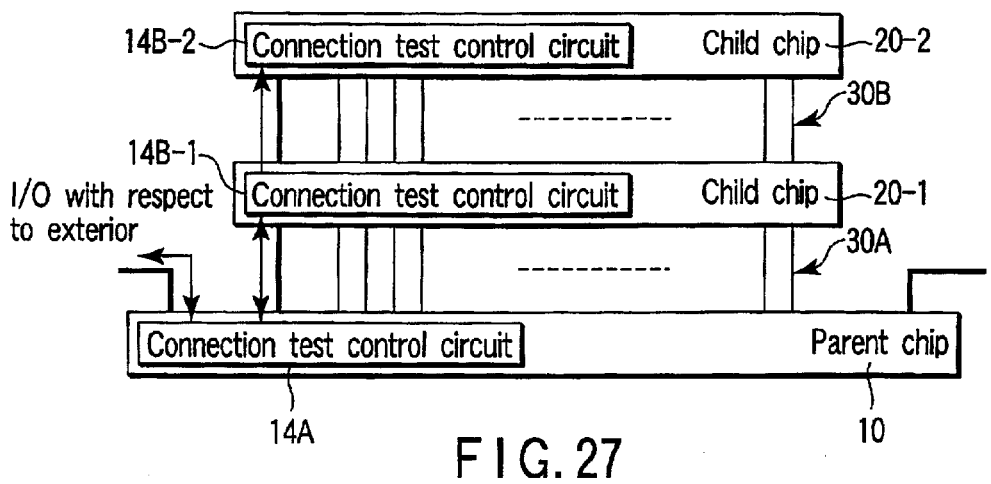
F I G. 27

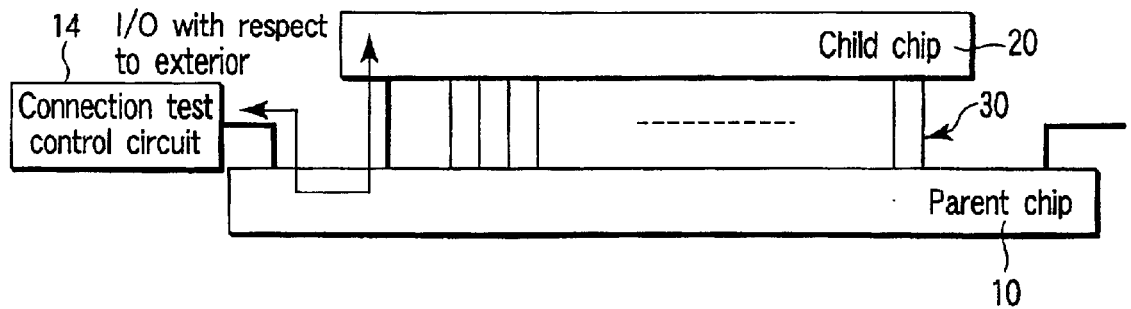
F I G. 28
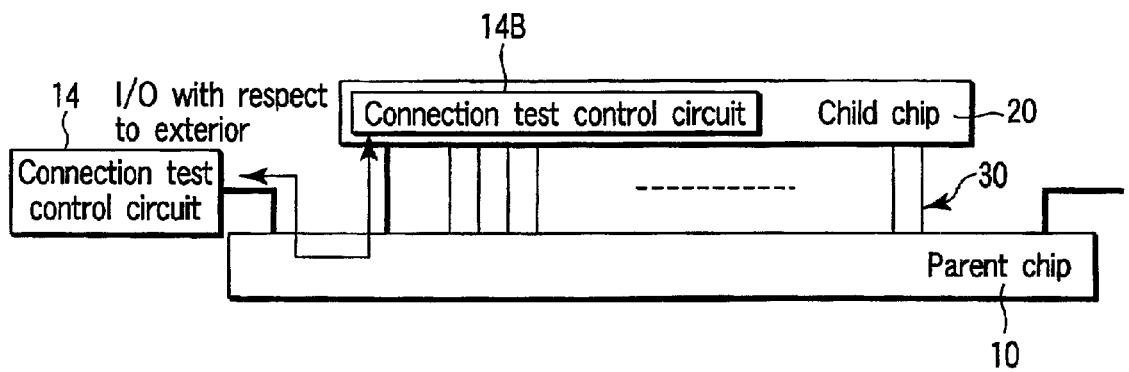
F I G. 29
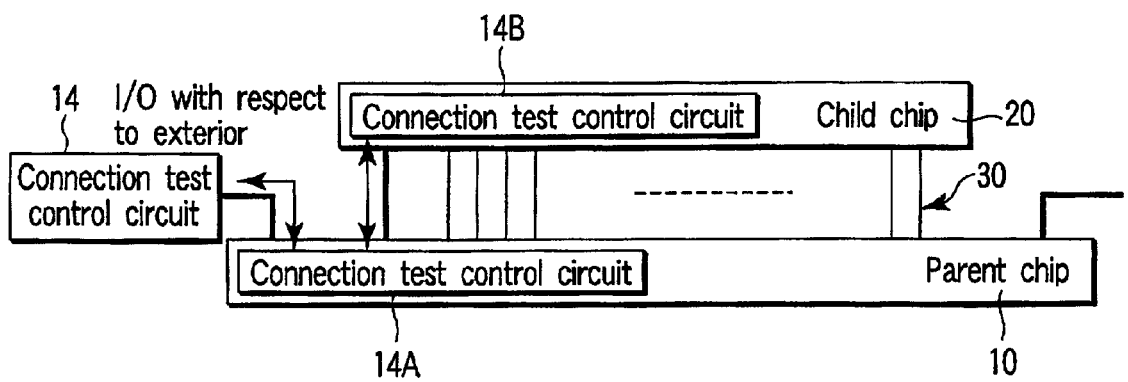
F I G. 30

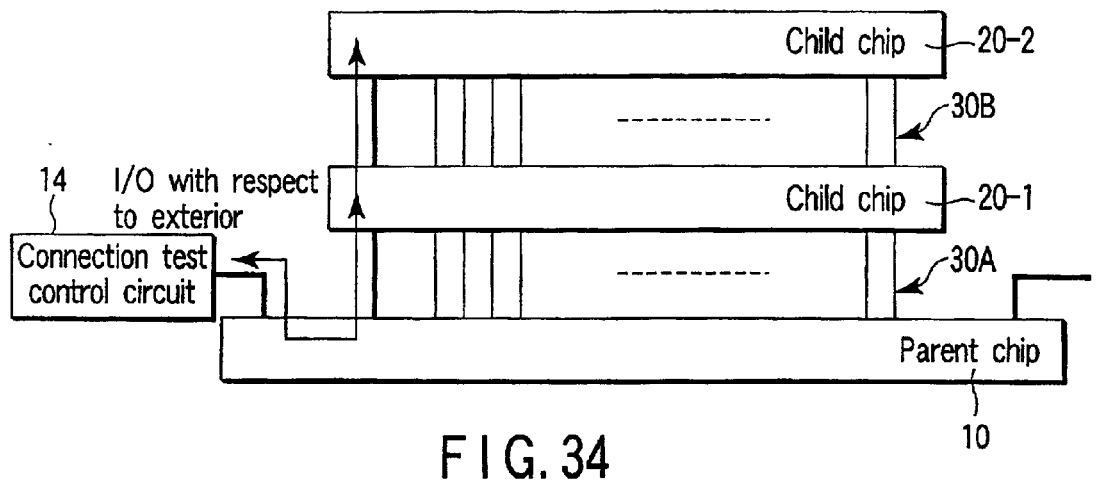
F I G. 34
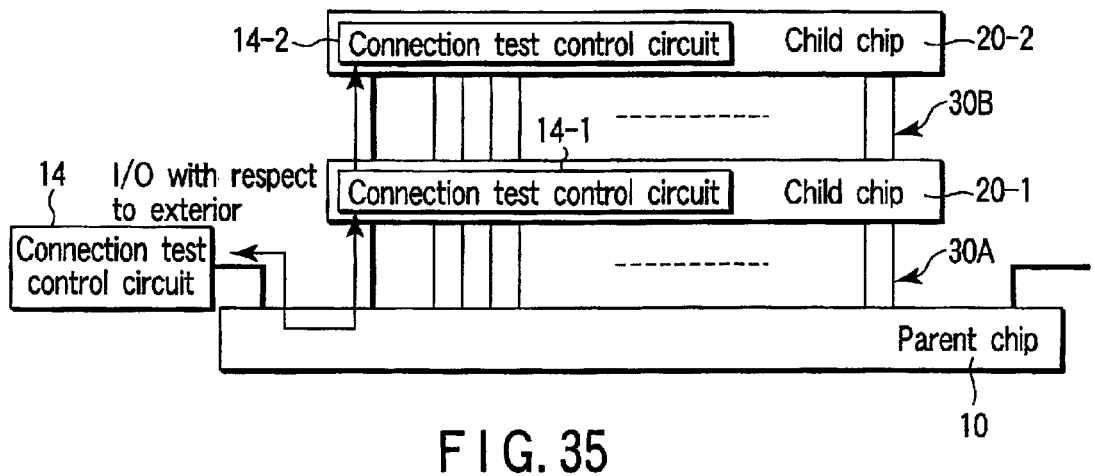
F I G. 35
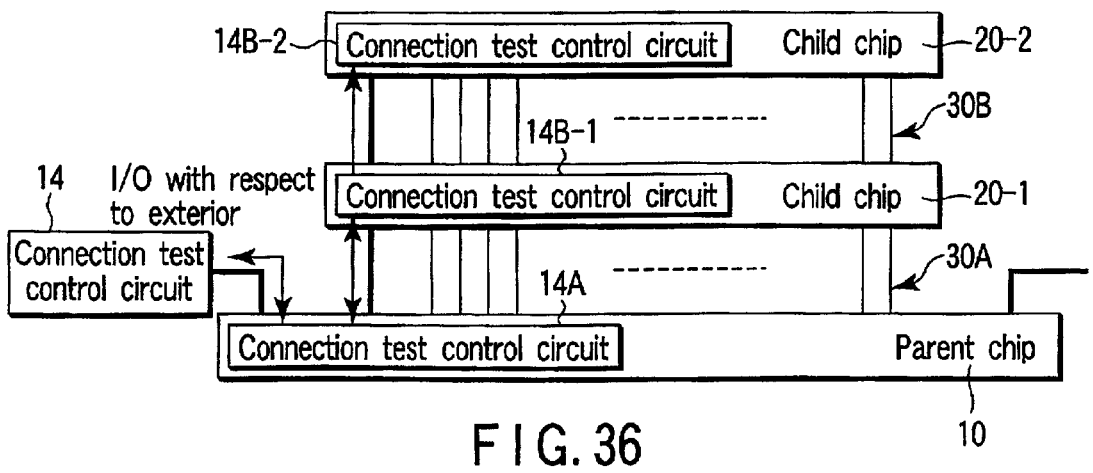
F I G. 36

FAULT TOLERANT SEMICONDUCTOR SYSTEM

CROSS-REFERENCE TO RELATED APPLICATIONS

This application is based upon and claims the benefit of priority from the prior Japanese Patent Application No. 2002-115210, filed Apr. 17, 2002, the entire contents of which are incorporated herein by reference.

BACKGROUND OF THE INVENTION

1. Field of the Invention

This invention relates to a semiconductor system, a connection test method of the semiconductor system, and a manufacturing method of the semiconductor system and more particularly to a fault tolerant semiconductor system and a fault correction technique for compensating for poor connection of a wiring between a plurality of semiconductor chips, a semiconductor chip and a wiring board or a semiconductor chip and a TAB tape in a semiconductor system having a plurality of semiconductor chips contained in one package.

2. Description of the Related Art

In order to realize data processing with broad band width, it is effective to use a semiconductor system (module) having a plurality of semiconductor chips contained in one package. In the above semiconductor system, it is necessary to make a function test of each semiconductor chip and a connection test between the semiconductor chips after electrical connection between the semiconductor chips is made by use of the flip chip technique, for example.

In this type of semiconductor system, the semiconductor chips are divided into a semiconductor chip (which is hereinafter referred to as a parent chip) having an external I/O and a semiconductor chip (which is hereinafter referred to as a child chip) having no external I/O.

FIG. 1 shows one example of a semiconductor system in which a parent chip 100 and a child chip 200 are arranged with respective main surfaces (element forming surfaces) 10*a*, 200*a* thereof set to face each other and electrodes formed on the element forming surfaces 100*a*, 200*a* of the chips are electrically connected to each other via wirings (bumps) 300.

In the semiconductor system with the above configuration, it is impossible to directly supply a test signal from the exterior to the child chip 200 having no external I/O. Therefore, a circuit used to transmit/receive a test signal between the parent chip 100 and the child chip 200 and a wiring used to transfer the test signal between the chips are provided.

Conventionally, in the above semiconductor system, a product which is determined to contain poor connection (or connection failure) as the result of the test for connection between the chips is dealt with as a defective product (fail). However, if the semiconductor product is further systemized in future and the number of semiconductor chips and the number of wirings between the chips are increased accordingly, the possibility that poor connection between the chips will occur becomes stronger. Therefore, there occurs a possibility that the manufacturing yield of the products is lowered due to poor connection between the chips and it is desired to take effective measures.

BRIEF SUMMARY OF THE INVENTION

According to an aspect of the present invention, there is provided a semiconductor system comprising a plurality of semiconductor chips, a first group of wirings which interconnect the plurality of semiconductor chips, a second group of wirings for redundancy which interconnect the plurality of semiconductor chips, a connection rearrange wiring section including a connection test circuit which makes a test for connection between the plurality of semiconductor chips by the first group of wirings and a connection rearrange circuit which makes unusable the wiring of the first group in which poor connection occurs and rearranges the connection between the semiconductor chips by use of the wiring of the second group when the poor connection is detected in the wiring of the first group by the connection test circuit, and a connection test control circuit which controls the rearrangement of connection between the plurality of semiconductor chips by the connection rearrange wiring section, the connection test control circuit includes a test data generating circuit which generates test data and a coincidence determination circuit which makes a connection test by use of test data formed by the test data generating circuit to determine whether poor connection occurs or not.

According to another aspect of the present invention, there is provided a semiconductor system comprising a plurality of semiconductor chips, a first group of wirings which interconnect the plurality of semiconductor chips, a second group of wirings for redundancy which interconnect the plurality of semiconductor chips, and a connection rearrange wiring section including a connection test circuit which makes a test for connection between the plurality of semiconductor chips by the first group of wirings and a connection rearrange circuit which makes unusable the wiring of the first group in which poor connection occurs and rearranges the connection between the semiconductor chips by use of the wiring of the second group when the poor connection is detected in the wiring of the first group by the connection test circuit, the connection test circuit includes a test data storage element which stores test data and a test result storage element which stores a test result, connection tests are made for the first group of wirings by use of the test data stored in the test data storage element and the test results are stored in the test result storage element.

According to still another aspect of the present invention, there is provided a semiconductor system comprising at least one semiconductor chip, a TAB tape which includes a first group of leads electrically connected to the semiconductor chip and a second group of leads for redundancy electrically connected to the semiconductor chip and on which the at least one semiconductor chip is mounted, and a connection rearrange interconnection section including a connection test circuit which makes a test for connection between the at least one semiconductor chip and the TAB tape and a connection rearrange circuit which makes unusable a lead of the first group in which poor connection occurs and rearranges the connection between the semiconductor chip and the TAB tape by use of the second group of wirings when the poor connection is detected in the lead of the first group by the connection test circuit.

According to still another aspect of the present invention, there is provided a connection test method which is used for a semiconductor system in which a plurality of semiconductor chips are interconnected via wirings, the plurality of semiconductor chips including a connection rearrange wiring section configured by a plurality of blocks each including a connection test circuit and connection rearrange circuit and a connection test control circuit including a test data generating circuit which generates test data and a coincidence determination circuit which detects whether or not poor connection occurs or not, and the connection test circuit including a test data storage element which stores test data and a test result storage element which stores the test result and which makes a connection test for the wirings at the time of boot by control of the connection test control circuit, comprising initializing the test result storage elements in the connection test circuits, generating test data by use of the test data generating circuit and writing the test data into the test data storage elements connected via scan paths, transferring and writing test data between and into the test data storage elements of the plurality of semiconductor chips via the wirings between the semiconductor chips, sequentially reading out values of the test data storage elements provided in the blocks of the plurality of semiconductor chips via the scan paths and sequentially writing the results of coincidence determination made by the coincidence determination circuit into the test data storage elements, recording the results of the connection tests stored in the test data storage elements into the test result storage elements of the respective blocks, repeatedly performing an operation of the recording of the test data to the recording of the test results into the test result storage elements with respect to a required test pattern, writing values of the test data storage elements into the test result storage elements of the respective blocks, and transferring the test result written into the test result storage element to the connection test control circuit via the scan path to determine connection pass/fail.

BRIEF DESCRIPTION OF THE SEVERAL VIEWS OF THE DRAWING

FIG. 18 is a circuit diagram showing another example of the configuration of the connection test circuit and connection rearrange circuit for redundancy wiring shown in FIG. 5 in the block of the connection rearrange wiring section;

FIG. 19 is a circuit diagram showing another example of the configuration of the connection test circuit and connection rearrange circuit for redundancy wiring shown in FIG. 5 in the block of the connection rearrange wiring section;

FIG. 25 is a schematic view for illustrating a sixth modification of the arrangement of the connection test control circuit according to the embodiment of the present invention;

FIG. 26 is a schematic view for illustrating a seventh modification of the arrangement of the connection test control circuit according to the embodiment of the present invention;

FIG. 27 is a schematic view for illustrating an eighth modification of the arrangement of the connection test control circuit according to the embodiment of the present invention;

FIG. 28 is a schematic view for illustrating a ninth modification of the arrangement of the connection test control circuit according to the embodiment of the present invention;

FIG. 29 is a schematic view for illustrating a tenth modification of the arrangement of the connection test control circuit according to the embodiment of the present invention;

FIG. 30 is a schematic view for illustrating an eleventh modification of the arrangement of the connection test control circuit according to the embodiment of the present invention;

FIG. 34 is a schematic view for illustrating a fifteenth modification of the arrangement of the connection test control circuit according to the embodiment of the present invention;

FIG. 35 is a schematic view for illustrating a sixteenth modification of the arrangement of the connection test control circuit according to the embodiment of the present invention;

FIG. 36 is a schematic view for illustrating a seventeenth modification of the arrangement of the connection test control circuit according to the embodiment of the present invention;

DETAILED DESCRIPTION OF THE INVENTION

A fault tolerant semiconductor system according to one aspect of this invention is a semiconductor system in which a plurality of semiconductor chips, at least one semiconductor chip and a wiring board, or at least one semiconductor chip and a TAB tape are interconnected and which includes redundancy wirings and a circuit used to correct poor connection in order to compensate for poor connection of wirings such as leads of the TAB tape, bonding wires and bumps for interconnection. When a plurality of semiconductor chips are used, the connection is rearranged by use of the same information for the semiconductor chips to correct the poor connection. For this purpose, a circuit which determines pass/fail of connection by causing a plurality of semiconductor chips in the semiconductor system to be cooperatively operated (by using the same test result in the plurality of semiconductor chips), a circuit which acquires common rearrange information in a plurality of semiconductor chips, a circuit which rearranges the connection of the wirings by use of the rearrange information and the like are provided.

There will now be described an embodiment of this invention with reference to the accompanying drawings.

Figure 1:
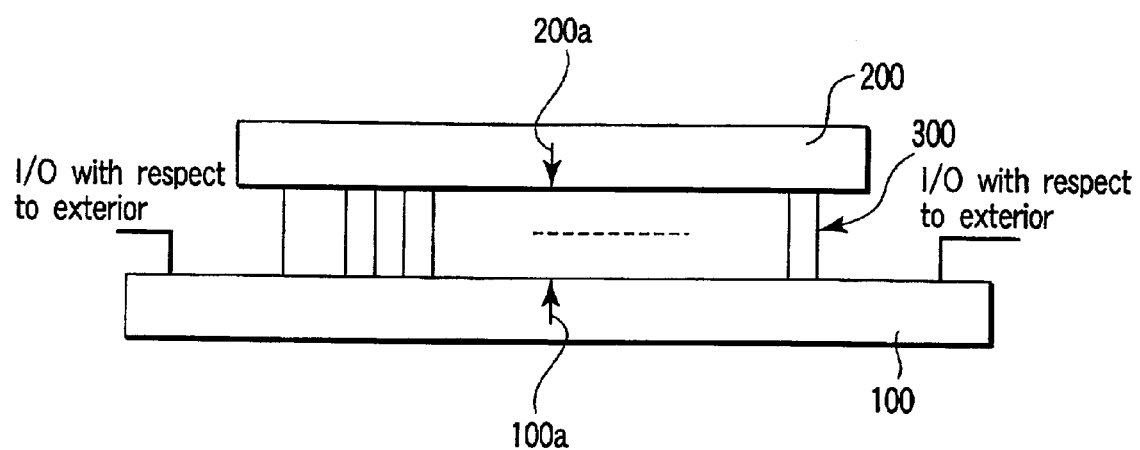
FIG. 1 is a schematic view showing an example of a semiconductor system in which parent and child chips are arranged with the element forming surfaces thereof set to face each other and I/O terminals formed on the chip surface are electrically connected via wirings (bumps), for illustrating a conventional semiconductor system.
Figure 2:
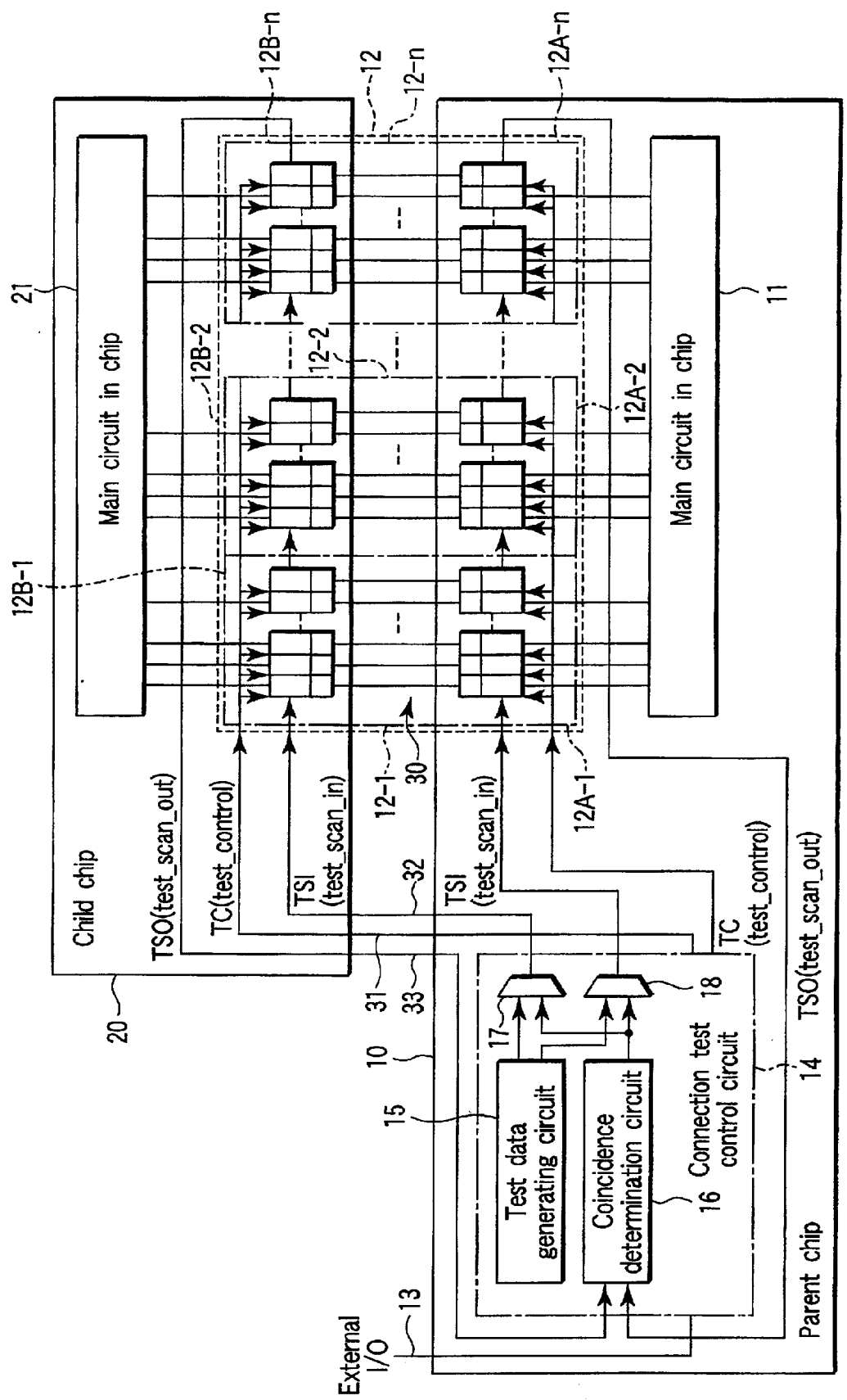
FIG. 2 is a circuit diagram showing the schematic configuration, for illustrating a semiconductor system according to an embodiment of the present invention.
Figure 3:
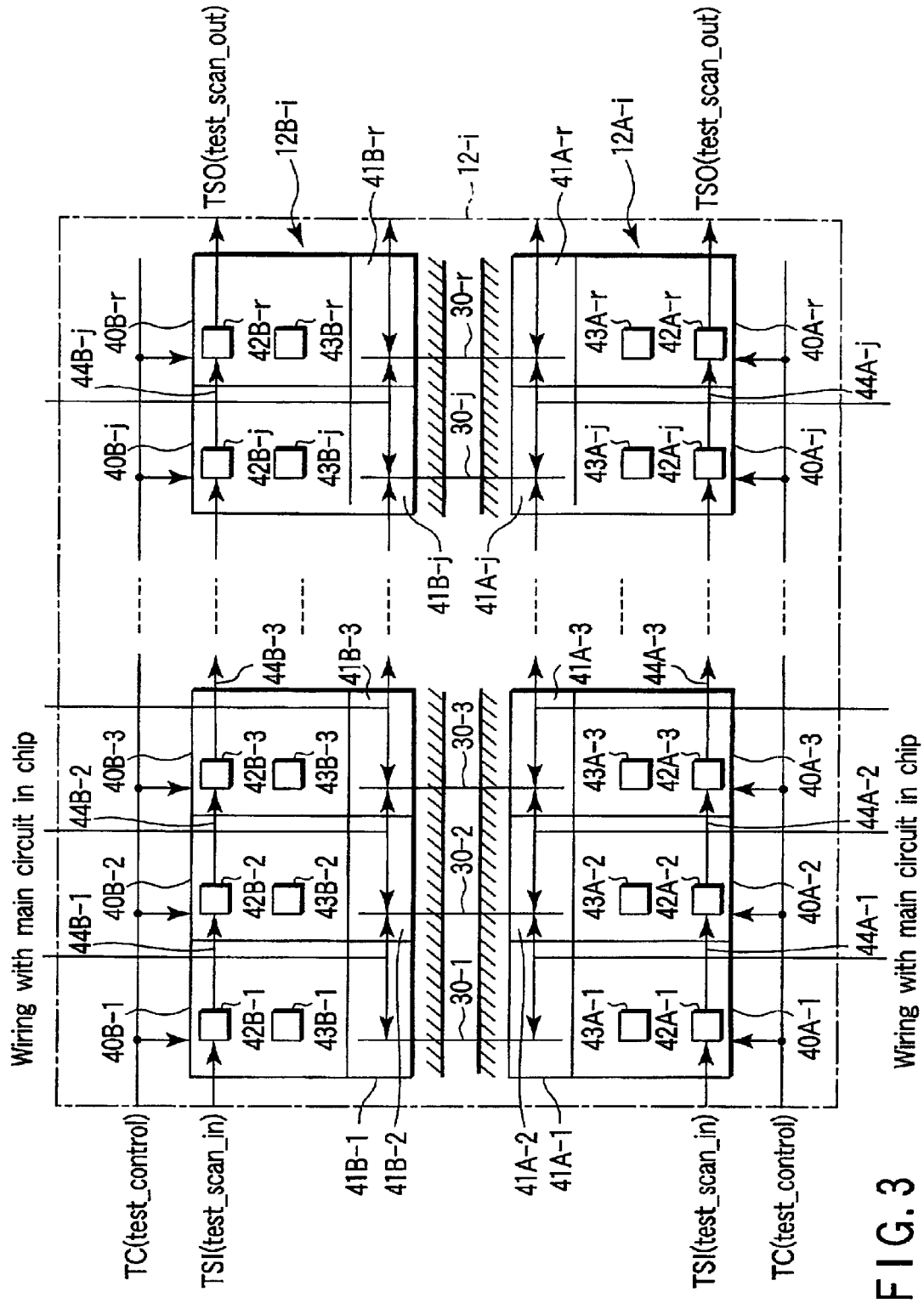
FIG. 3 is a circuit diagram showing an example of the configuration of one block of a connection rearrange wiring section in the circuit shown in FIG. 2, for illustrating the semiconductor system according to the embodiment of the present invention.
Figure 4:
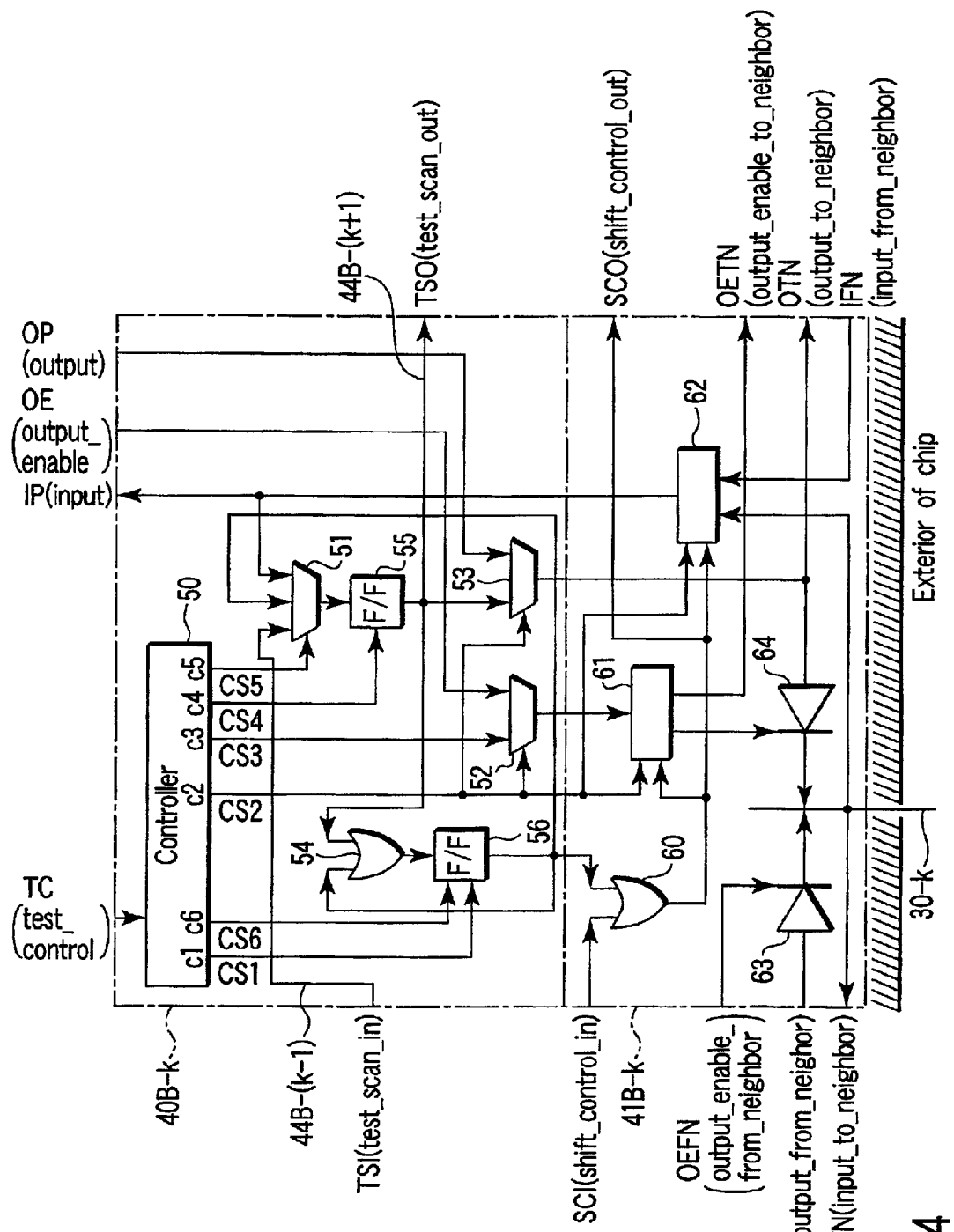
FIG. 4 is a circuit diagram showing an example of the concrete configuration of a connection test circuit and connection rearrange circuit in the circuit shown in FIG. 3, for illustrating the semiconductor system according to the embodiment of the present invention.
Figure 5:
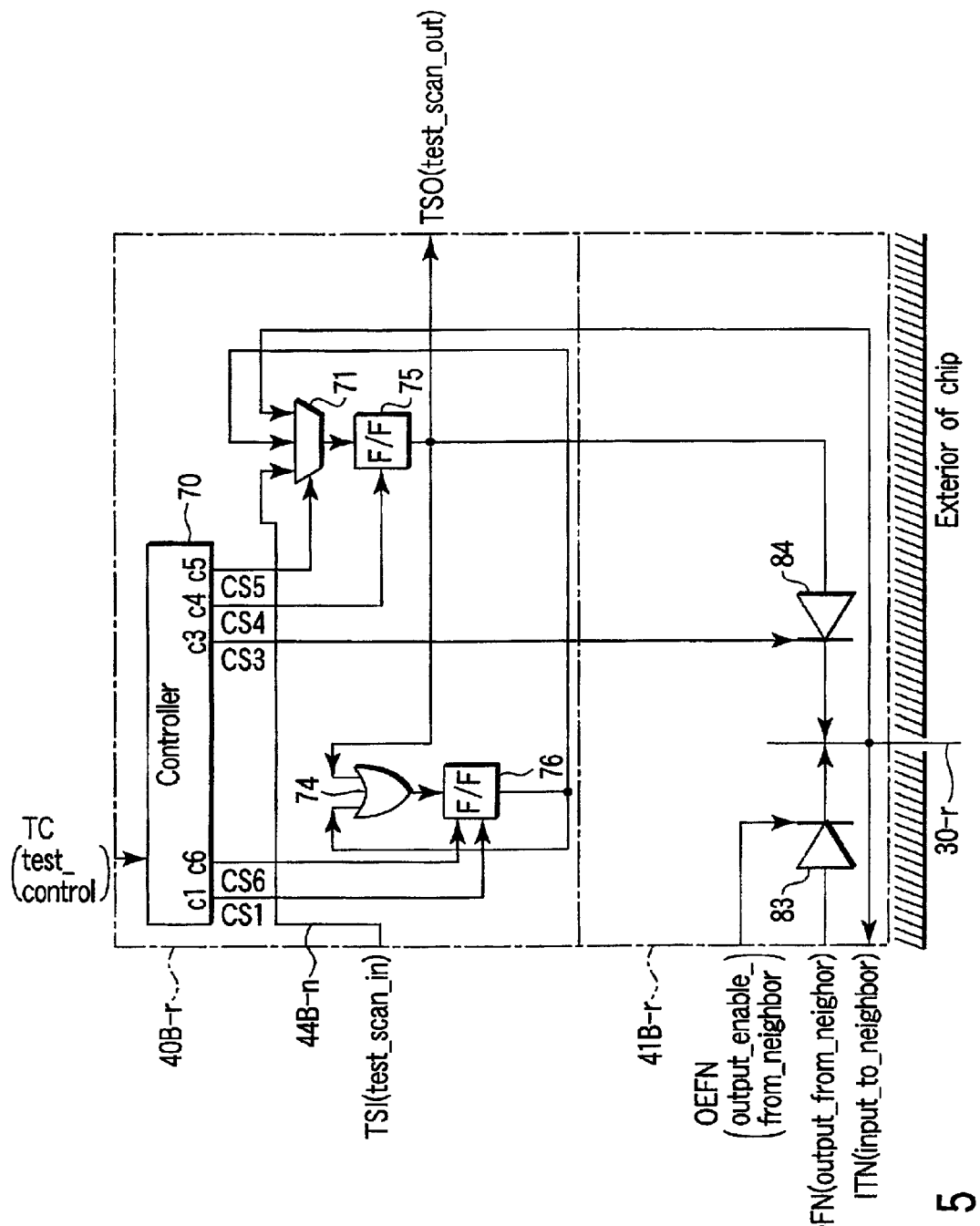
FIG. 5 is a circuit diagram showing an example of the concrete configuration of a connection test circuit and connection rearrange circuit for redundancy wiring in the circuit shown in FIG. 3, for illustrating the semiconductor system according to the embodiment of the present invention.
Figure 6:
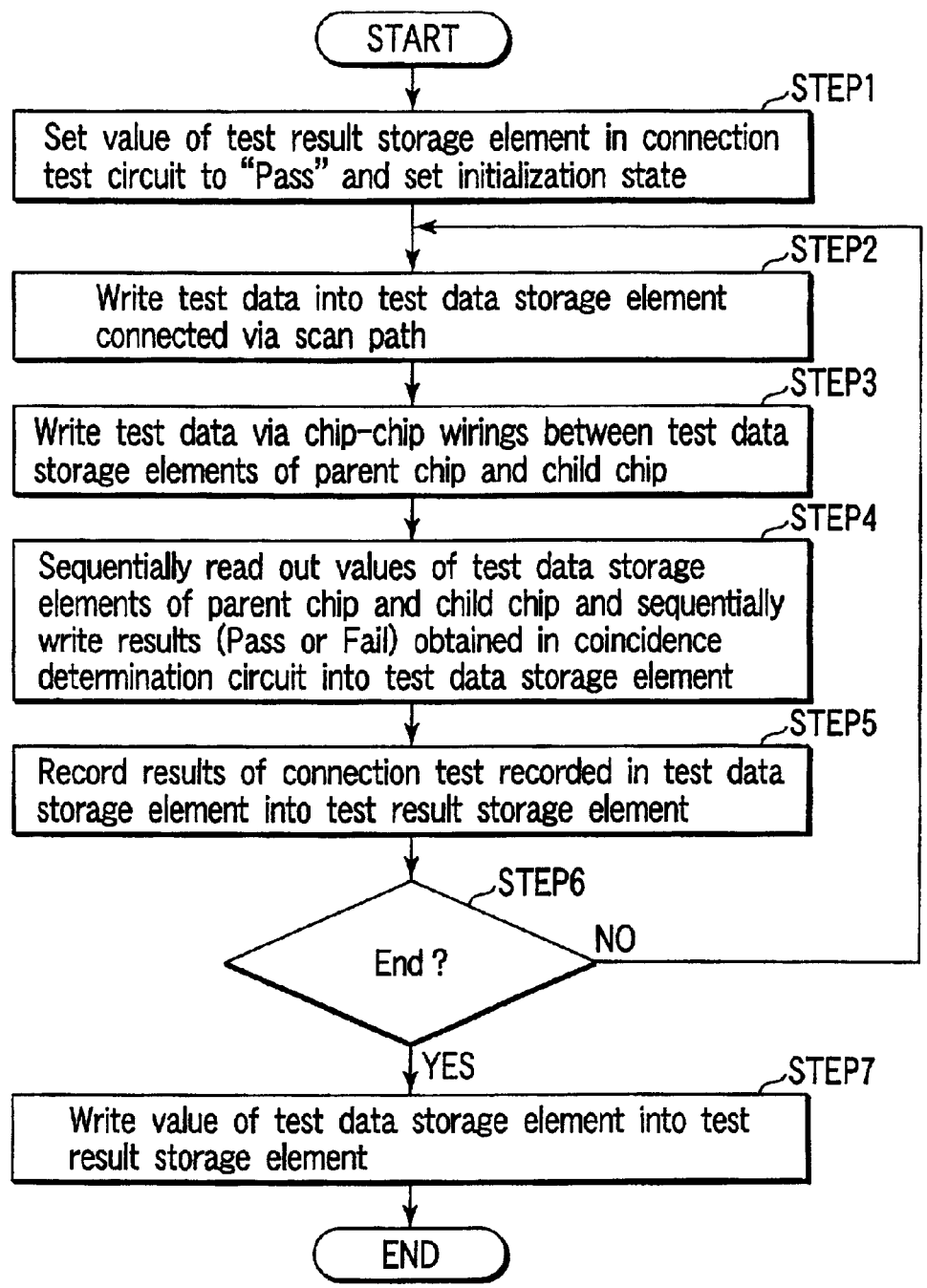
FIG. 6 is a flowchart for illustrating the schematic operation of a connection test made in the circuits shown in FIGS. 2 to 5, for illustrating the semiconductor system according to the embodiment of the present invention.

FIGS. 2 to 13 show an example of a semiconductor module having two semiconductor chips stacked and mounted on each other, for illustrating a semiconductor system according to an embodiment of the present invention. FIG. 2 is a circuit diagram showing the schematic configuration thereof and FIG. 3 is a circuit diagram showing an example of the configuration of one block of a connection rearrange wiring section in the circuit shown in FIG. 2. Further, FIG. 4 is a circuit diagram showing an example of the concrete configuration of a connection test circuit and connection rearrange circuit in the circuit shown in FIG. 3 and FIG. 5 is a circuit diagram showing an example of the concrete configuration of a connection test circuit and connection rearrange circuit for redundancy wiring in the circuit shown in FIG. 3. FIG. 6 is a flowchart for illustrating the schematic operation of a connection test made in the circuits shown in FIGS. 2 to 5 and FIG. 7 is a flowchart for illustrating the concrete operation of a connection test made in the circuits shown in FIGS. 2 to 5. Further, FIGS. 8 to 13 are timing charts of various signals with much attention paid to the operation of a controller, for illustrating various operations of the circuits shown in FIGS. 4 and 5.

As shown in FIG. 2, the semiconductor system has two semiconductor chips including a parent chip 10 and child chip 20 which are arranged with the main surfaces (element forming surfaces) of the parent chip 10 and child chip 20 set to face each other. Electrodes formed on the element forming surfaces are connected via a plurality of wirings 30. As the wiring 30, a bump, bonding wire or the like is used.

In the parent chip 10, portions 12A-1 to 12A-n of blocks 12-1 to 12-n which configure a connection rearrange wiring section 12, external I/O terminal 13, connection test control circuit 14 and the like are formed in addition to a main circuit 11 in the chip. In the connection test control circuit 14, a test data generating circuit 15 which generates test data, a coincidence determination circuit (for example, exclusive OR circuit) 16 which determines pass/fail after the writing operation in the connection test, and selectors 17, 18 which each select one of the output signals of the test data generating circuit 15 and coincidence determination circuit 16 are formed.

On the other hand, in the child chip 20, the remaining portions 12B-1 to 12B-n of the blocks which correspond to the portions 12A-1 to 12A-n of the blocks of the parent chip 10 are formed in addition to a main circuit 21 in the chip.

Between the parent chip 10 and the child chip 20, wirings 31, 32, 33 of a required bit number which are used to control the connection test and transfer test data are formed in addition to the wirings 30 to be tested for connection and used in the normal operation. The wiring 31 is used to transfer a test control signal TC (test_control) from the connection test control circuit 14 in the parent chip 10 to the portions 12B-1 to 12B-n of the blocks of the connection rearrange wiring section in the child chip 20, and the wiring 32 is used to transfer a test scan input signal TSI (test_scan_in). Further, the wiring 33 is used to transfer a test scan output signal TSO (test_scan_out) from the portions 12B-1 to 12B-n of the blocks of the connection rearrange wiring section to the connection test control circuit 14 in the parent chip 10. The wirings 31, 32, 33 can be provided exclusively for the connection test, but may be commonly provided together with the wirings 30 which are used in the normal operation and the wirings can be selectively used depending on the operation mode.

FIG. 3 shows an example of the concrete configuration of the block 12-$i$ ($i$=1 to n) which configure the connection rearrange wiring section 12. The parent chip 10 and the child chip 20 are connected to each other via wirings 30-1 to 30-$j$ and one redundancy wiring 30-$r$. In the parent chip 10, connection test circuits 40A-1 to 40A-j, 40A-r used to make connection tests for the respective wirings 30-1 to 30-$j$, 30-$r$ and connection rearrange circuits 41A-1 to 41A-j, 41A-r used to rearrange the connection are provided. Further, in the child chip 20, connection test circuits 40B-1 to 40B-j, 40B-r and connection rearrange circuits 41B-1 to 41B-j, 41B-r are provided for the respective wirings 30-1 to 30-$j$, 30-$r$.

In the connection test circuits 40A-1 to 40A-j, 40A-r of the parent chip 10, test data storage elements 42A-1 to 42A-j, 42A-r and test result storage elements 43A-1 to 43A-j, 43A-r are respectively provided. Further, in the connection test circuits 40B-1 to 40B-j, 40B-r of the child chip 20, test data storage elements 42B-1 to 42B-j, 42B-r and test result storage elements 43B-1 to 43B-j, 43B-r are respectively provided.

The test data storage elements 42A-i (i=1 to j, r) are respectively connected to the test data storage elements 42A-(i+1) which are respectively connected to the adjacent wirings via scan paths 44A-1 to 44A-j and the test data storage elements 42B-i (i=1 to j, r) are respectively connected to the test data storage elements 42B-(i+1) which are respectively connected to the adjacent wirings via scan paths 44B-1 to 44-j. Then, the test data storage elements 42A-i (i=1 to j, r) and 42B-i (i=1 to j, r) can transfer data with respect to the connection test control circuit 14 in the parent chip 10.

The other blocks are formed with the same configuration as described above and the portions 12A-1 to 12A-n and the remaining portions 12B-1 to 12B-n of the blocks 12-1 to 12-$n$ configuring the connection rearrange wiring section 12 in the parent chip 10 and child chip 20 are connected to each other via the scan paths.

In order to clarify the explanation, in FIG. 3, a case wherein one redundancy wiring 30-$r$ is provided for n blocks 12-1 to 12-$n$ configuring the connection rearrange wiring section 12 is explained and the wiring rearranging process is permitted only for the adjacent wiring. Therefore, the blocks 12-1 to 12-$n$ configuring the connection rearrange wiring section 12 can be used to correct poor connection (compensate for poor connection) of one wiring.

In the following description, the block which is configured by the connection test circuit and the connection rearrange circuit which are explained is referred to as the present stage, the block which lies before the above block is referred to as a preceding stage and the block which lies after the above block is referred to as a succeeding stage. The last stage block is a block of the redundancy wiring.

FIG. 4 shows an example of the concrete configuration of the connection test circuit 40B-k (k=1 to j) and connection rearrange circuit 41B-k (k=1 to j) in the block 12B-i (i=1 to n) of the connection rearrange wiring section 12 shown in FIG. 3. The circuit is bi-directionally connected to the main circuit 21 of the child chip 20 to transfer an input signal IP (input), output signal OP (output) and output enable signal OE (output_enable) and the chip—chip wiring 30-$k$ is also bi-directionally connected.

The connection test circuit 40B-k is configured to include a controller 50, selectors 51, 52, 53, OR gate 54 and flip-flops (F/F) 55, 56. The controller 50 receives a test control signal TC (test_control) output from the connection test control circuit 14 of the parent chip 10 and generates and outputs control signals CS1 to CS6 from output terminals c1 to c6 so as to control the operations of the connection test circuit 40B-k and connection rearrange circuit 41B-k. The control signal CS1 is a signal used to control the writing operation into the flip-flop 56 which acts as the test result storage element 43B-i in the circuit shown in FIG. 3. The control signal CS2 is a signal indicating whether or not the connection test is being made. The control signal CS3 is an output enable signal used to control output to the chip—chip wiring 30-$k$ at the time of connection test. The control signal CS4 is a signal used to control the writing operation into the flip-flop 55 which acts as the test data storage element 42B-i shown in FIG. 3. The control signal CS5 is a select control signal of the selector 51. The control signal CS6 is a reset signal of the flip-flop 56.

The selector 51 is an input selector used for the flip-flop 55. At the time of connection test, the flip-flop 55 is used to hold test data, hold input data from the chip—chip wiring 30-$k$ and hold a value of the flip-flop 56. Further, the flip-flop 55 is connected to the connection test circuits 40B-(k−1) and 40B-(k+1) via the scan paths 44B-(k−1) and 44B-(k+1) of the preceding and succeeding stages, respectively. A test scan input signal TSI (test_scan_in) is input from the connection test circuit 40B-(k−1) of the preceding stage via the scan path 44B-(k−1) and selector 51 and a test scan output signal TSO (test_scan_out) is output to the connection test circuit 40B-(k+1) of the succeeding stage via the scan path 44B-(k+1).

The OR gate 54 is a circuit which always maintains the flip-flop 56 in a Fail state if Fail which is information indicating a connection failure or poor connection is written even once when a test result is written from the flip-flop 55 into the flip-flop 56.

The selector 52 is a circuit which switches the output enable signal to the chip—chip wiring 30-$k$ for an output buffer 64 to the control signal CS3 at the test operation time and to the output enable signal OE from the main circuit 21 of the chip at the normal operation time.

The selector 53 is a circuit which switches an output to the chip—chip wiring 30-$k$ to an output signal from the flip-flop 55 at the test operation time and to an output OP from the main circuit 21 of the chip at the normal operation time. An output signal of the selector 53 is supplied to the input terminal of the output buffer 64 and to the connection rearrange circuit 41B-(k+1) of the succeeding stage as an output signal OTN (output_to_neighbor).

On the other hand, the connection rearrange circuit 41B-k includes an OR gate 60, selectors 61, 62 and output buffers (tri-state buffers) 63, 64. The OR gate 60 is a circuit which generates a signal indicating whether connection is to be rearranged or not. The OR gate 60 generates a signal indicating that connection is rearranged in the following case. The first case is a case wherein it is indicated that the rearranging process is performed in the connection rearrange circuit 41B-(k−1) of the preceding stage by a shift control input signal SCI (shift_control_in). The second case is a case wherein Fail which is information indicating a connection failure is written into the flip-flop 56 and it is indicated that the present stage performs the rearranging process. The OR gate 60 is not necessary in the first stage 41B-1 of the connection rearrange circuit and only a value of the flip-flop 56 is used as a signal which indicates whether connection is rearranged or not.

The selector 61 is a circuit which switches the output destination of the selector 52 according to whether connection is rearranged or not in response to the output of the flip-flop 56 or OR gate 60. When connection is not to be rearranged, a selected value by the selector 52 is output to the output buffer 64 of the present stage and specification of an output unable state is made with respect to the output buffer 63 of the connection rearrange circuit 41B-(k+1) of the succeeding stage by use of an output enable signal OETN (output_enable_to_neighbor). On the other hand, if connection is to be rearranged, specification of an output unable state is made with respect to the output buffer 64 of the present stage and specification of an enable state is made with respect to the output buffer 63 of the succeeding stage by use of the output enable signal OETN. In this case, however, if it is indicated that the connection test is being made by the control signal CS2, the output destination of the selector 52 is set to the output buffer 64 irrespective of the output signal of the flip-flop 56 or OR gate 60 and specification of the output unable state is made with respect to the output buffer 63 of the succeeding stage.

The selector 62 is a circuit which switches the chip—chip wiring 30-k supplying a signal input to the flip-flop 55 and the main circuit 21 of the chip according to whether connection is rearranged or not in response to the control signal CS2 output from the controller 50 or an output of the OR gate 60. When the connection is not rearranged, the chip—chip wiring 30-k of the present stage is selected and when the connection is rearranged, an input signal IFN (input_from_neighbor) from the chip—chip wiring 30-(k+1) of the succeeding stage is selected.

An output signal OFN (output_from_neighbor) from the connection rearrange circuit 41B-(k−1) of the preceding stage is supplied to the input terminal of the output buffer 63 and an output enable signal OEFN (output_enable_from_neighbor) from the connection rearrange circuit 41B-(k−1) of the preceding stage is supplied to the output control terminal thereof.

The connection test circuit 40A-k (k=1 to j) and connection rearrange circuit 41A-k (k=1 to j) of the block 12A-i (i=1 to n) of the connection rearrange wiring section 12 of the parent chip 10 also have basically the same circuit configuration as that of the block 12B-i of the child chip 20.

FIG. 5 shows an example of the concrete configuration of the connection test circuit 40B-r and connection rearrange circuit 41B-r for the redundancy wiring 30-r in the circuit shown in FIG. 3. In the circuit, the chip—chip wiring 30-r is bi-directionally connected, but has no connection with the main circuit 21 of the child chip 20.

The connection test circuit 40B-r includes a controller 70, selector 71, OR gate 74 and flip-flops 75, 76. The controller 70 receives a test control signal TC (test_control) output from the connection test control circuit 14 of the parent chip 10 to control the operations of the connection test circuit 40B-r and connection rearrange circuit 41B-r. The controller 70 generates control signals CS1, CS3 to CS6. The control signal CS1 is a signal used to control the writing process into the flip-flop (test result storage element) 76. The control signal CS3 is an output enable signal used to control output to the chip—chip wiring 30-r at the time of connection test. The control signal CS4 is a signal used to control the writing process into the flip-flop (test data storage element) 75. The control signal CS5 is a select control signal for the selector 71. The control signal CS6 is a reset signal for the flip-flop 76.

The selector 71 is an input selector for the flip-flop 75. The selector 71 is connected to the connection test circuit 40B-j of the preceding stage via the scan path 44B-j. A test scan input signal TSI (test_scan_in) is input to the flip-flop 75 via the selector 71. The flip-flop 75 is used to hold input data from the chip—chip wiring 30-r, hold a value of the flip-flop (test result storage element) 76 and hold test data at the time of connection test. An output signal of the flip-flop 75 is supplied to one input terminal of the OR gate 74 and to the coincidence determination circuit 16 in the connection test control circuit 14 shown in FIG. 2 as a test scan output signal TSO (test_scan_out).

The OR gate 74 is a circuit which always maintains the flip-flop 76 in a Fail state if Fail which is information indicating a connection failure is written even once when a test result is written from the flip-flop 75 into the flip-flop 76.

Further, the connection rearrange circuit 41B-r includes output buffers (tri-state buffers) 83, 84. When connection has been rearranged, an output enable signal OETN (output_enable_to_neighbor) is supplied from the connection rearrange circuit 41B-j of the preceding stage to the output buffer 83. Further, the control signal CS3 output from the controller 70 is supplied to the output control terminal of the output buffer 84 and a value of the flip-flop 75 is supplied to the input terminal thereof.

The connection test circuit 40A-r and connection rearrange circuit 41A-r of the block 12A-r of the connection rearrange wiring section 12 of the parent chip 10 also have basically the same circuit configuration as that of the block 12B-i of the child chip 20.

Next, the connection test operation performed in the circuit shown in FIGS. 2 to 5 is schematically explained with reference to the flowchart of FIG. 6. In this example, it is assumed that the connection test is made each time the semiconductor system is booted by control of the connection test control circuit 14 provided in the semiconductor system. In this case, the connection test result can be stored in a volatile element such as a flip-flop.

However, if the connection test is made at each booting time, it becomes necessary to provide a circuit for the connection test outside the semiconductor system. Since test results obtained at the time of manufacturing can be kept held if electrical fuses or nonvolatile elements are used as the test result storage elements, a circuit for the connection test becomes unnecessary after the manufacturing process. Further, it can be considered to use a method for writing the test result into a ROM at the time of manufacturing and reading out the test result from the ROM at the booting time.

As shown in FIG. 6, first, an initialization state is set by setting values of the test result storage elements 43A-1 to 43A-j, 43A-r and 43B-1 to 43B-j, 43B-r (flip-flops 56, 57) in the connection test circuits 40A-1 to 40A-j, 40A-r and 40B-1 to 40B-j, 40B-r to "Pass" (STEP1).

Then, test data is formed by the test data generating circuit 15 and written into the test data storage elements 42A-1 to 42A-j, 42A-r and test data storage elements 42B-1 to 42B-j, 42B-r which are connected thereto via the scan paths 44A-1 to 44A-j and 44B-1 to 44B-j (STEP2). At this time, the test data items are set to have inverted values in the parent chip 10 and child chip 20.

After this, test data is written via the chip—chip wirings 30-1 to 30-j, 30-r between the test data storage elements 42A-1 to 42A-j, 42A-r and test data storage elements 42B-1 to 42B-j, 42B-r of the parent chip 10 and child chip 20 (STEP3). Values of the test data storage elements of the parent chip 10 and child chip 20 will be set to the same values if poor connection does not occur.

Next, the values of the test data storage elements 42A-1 to 42A-j, 42A-r and 42B-1 to 42B-j, 42B-r of the parent chip 10 and child chip 20 are sequentially read out via the scan paths 44A-1 to 44A-j and 44B-1 to 44B-j and the results (Pass or Fail) obtained by coincidence determination in the coincidence determination circuit 16 are sequentially written into the test data storage elements (STEP4). By the above process, the connection test results are written into the test data storage elements 42A-1 to 42A-j, 42A-r and 42B-1 to 42B-j, 42B-r of the parent chip 10 and child chip 20.

Then, the connection test results written in the test data storage elements 42A-1 to 42A-j, 42A-r and 42B-1 to 42B-j, 42B-r are stored into the test result storage elements 43A-1 to 43A-j, 43A-r and 43B-1 to 43B-j, 43B-r in the connection test circuits 40A-1 to 40A-j, 40A-r and 40B-1 to 40B-j, 40B-r (STEP5). In this case, however, if Fail is already written in the test result storage element, it is not changed. Therefore, if a wiring is once determined as a fail in the connection test, the wiring which is determined as Fail will never be determined as a non-defective product (Pass).

Next, whether the process is ended or not is determined (STEP6) and the operation of STEP2 to STEP5 is repeatedly performed for a required test pattern. In the case of a bi-directional bus, the writing direction is changed and the above operation is repeatedly performed.

Finally, the values of the test data storage elements 42A-1 to 42A-j, 42A-r and 42B-1 to 42B-j, 42B-r are written into the test result storage elements 43A-1 to 43A-j, 43A-r and 43B-1 to 43B-j, 43B-r in the connection test circuits 40A-1 to 40A-j, 40A-r and 40B-1 to 40B-j, 40B-r. Then, the values are supplied to the connection test control circuit 14 via the scan paths 44A-1 to 44A-j and 44B-1 to 44B-j and result determination of the connection test is performed by the coincidence determination circuit 16. In this example, since the connection rearrangement cannot be made if two or more connection failures occur in one of the connection rearrange wiring sections, the semiconductor system is dealt with as a faulty product. Since the connection rearrangement can be made if no connection failure occurs or only one connection failure occurs in the blocks 12-1 to 12-n of each of the connection rearrange wiring sections 12, the semiconductor system is dealt with as a non-defective product (STEP7).

By the connection test operation as described above, if the semiconductor system is deal with as a non-defective product and Fail is written in the test result storage element of one block, the connection rearrangement is made for the above block and all of the blocks which lie in the succeeding stage of the above block.

Figure 7:
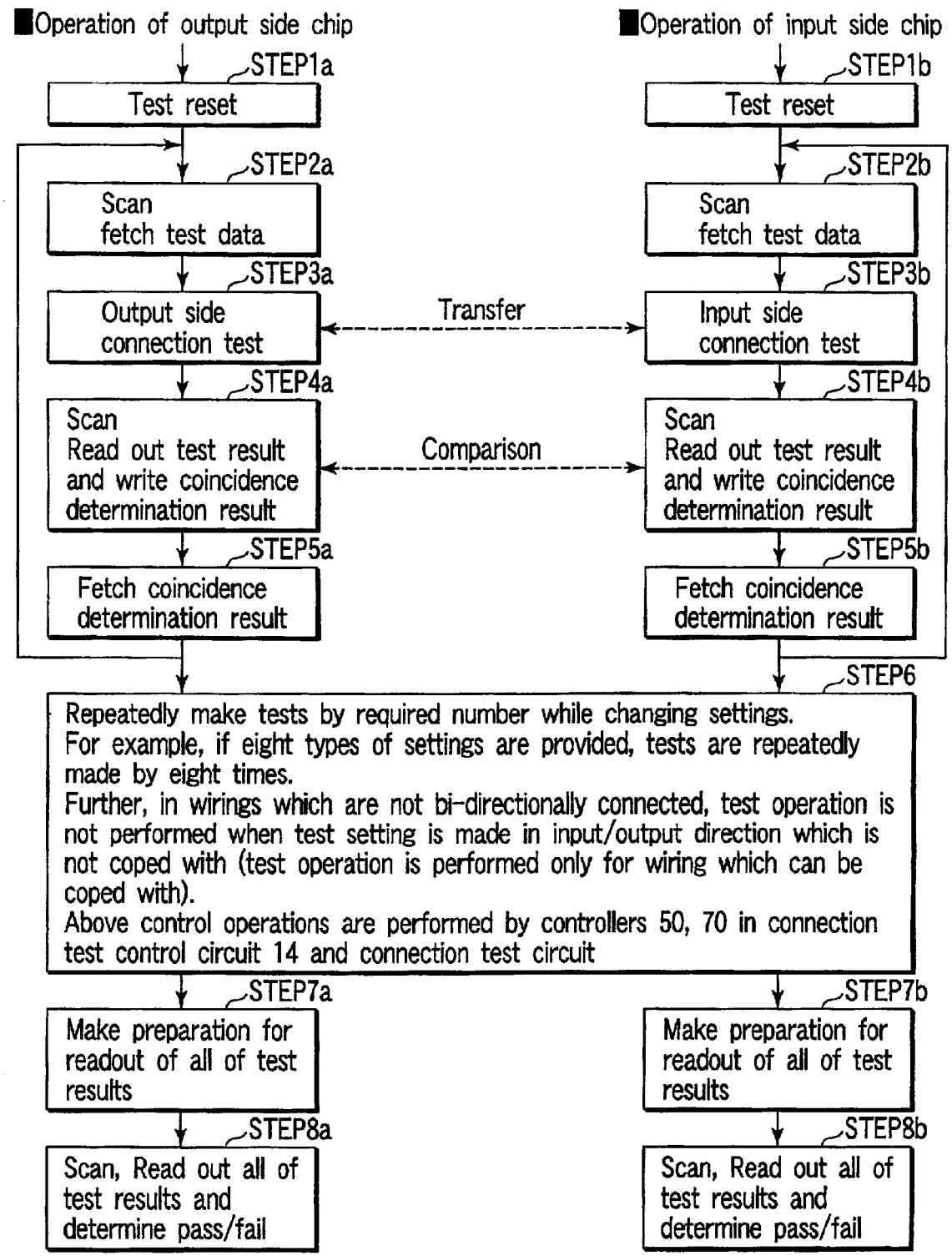
FIG. 7 is a flowchart for illustrating the concrete operation of a connection test made in the circuits shown in FIGS. 2 to 5, for illustrating the semiconductor system according to the embodiment of the present invention.

FIG. 7 is a flowchart for more specifically illustrating the connection test operation described above and FIGS. 8 to 13 are timing charts for illustrating concrete operations of the controller 50 (70).

As described before, test data items are set to have inverted values in the input side chip and output side chip of the two semiconductor chips 10, 20 mounted in the stacked form and, for example, it is assumed that the following test patterns A, B, C, D are obtained.

Test pattern A output side: 00000 . . . , input side: 11111 . . . ,

Test pattern B output side: 11111 . . . , input side: 00000 . . . ,

Test pattern C output side: 01010 . . . , input side: 10101 . . . ,

Test pattern D output side: 10101 . . . , input side: 01010 . . . .

Further, assume that the following relation is obtained.

(1) Child chip 20: output, Parent chip 10: input is the test pattern A, (2) Child chip 20: output, Parent chip 10: input is the test pattern B, (3) Child chip 20: output, Parent chip 10: input is the test pattern C, (4) Child chip 20: output, Parent chip 10: input is the test pattern D, (5) Child chip 20: input, Parent chip 10: output is the test pattern A, (6) Child chip 20: input, Parent chip 10: output is the test pattern B, (7) Child chip 20: input, Parent chip 10: output is the test pattern C, (8) Child chip 20: input, Parent chip 10: output is the test pattern D.

The controllers 50 provided in the connection test circuits 40A-1 to 40A-j, 40A-r and 40B-1 to 40B-j, 40B-r form control signals CS1 to CS6 used to control the respective circuits in the connection test circuits in response to the test control signal TC output from the connection test control circuit 14. The test control signal TC is a common control signal input to all of the connection test circuits and individually formed and output for the parent chip 10 and child chip 20. The test control signal TC is of a plural-bit (for example, 4-bit) configuration. The test control signal TC[0] (one bit) is a clock signal used for operation control and a pulse is output as required at the time of input of test data or the like.

The test control signal TC[3:1] (three bits) is a signal used to determine the operation mode of each connection test circuit. For example, each connection test circuit is set to the following operation mode by the test control signal TC[3:1].

"000": normal operation (non-test mode),

"001": scan (fetching of test data, readout of test result, fetching of comparison result), "010": output side connection test, "011": input side connection test, "100": fetching of coincidence determination result, "101": preparation for readout of all test results, "111": test reset.

Figure 8:
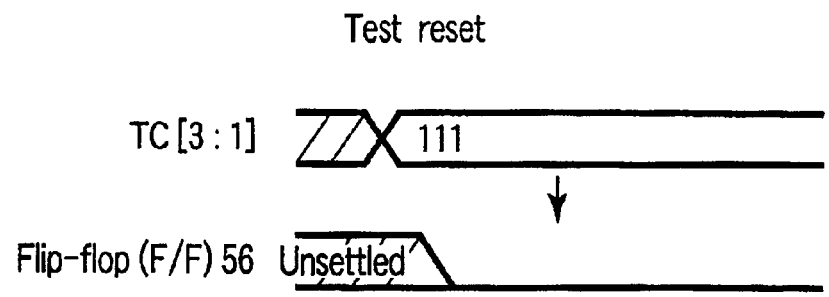
FIG. 8 is a timing chart of various signals, for illustrating a test reset operation in the circuits shown in FIGS. 4 and 5.
Figure 9:
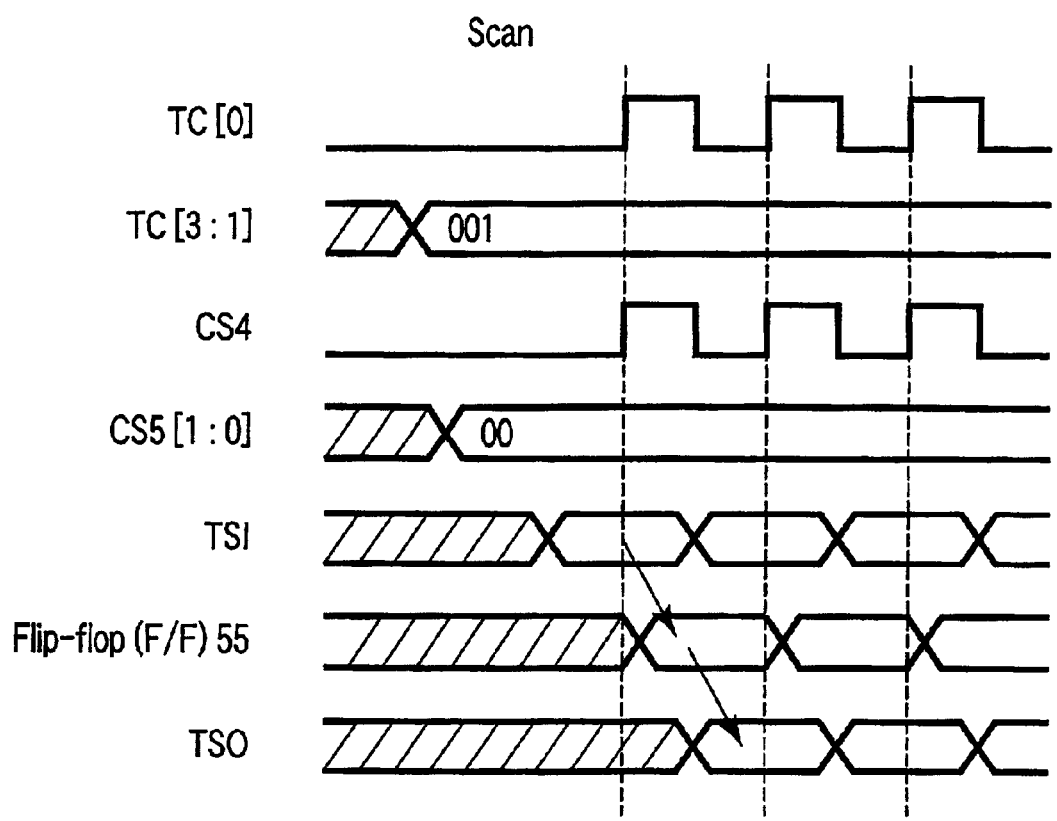
FIG. 9 is a timing chart of various signals, for illustrating a scan operation in the circuits shown in FIGS. 4 and 5.
Figure 10:
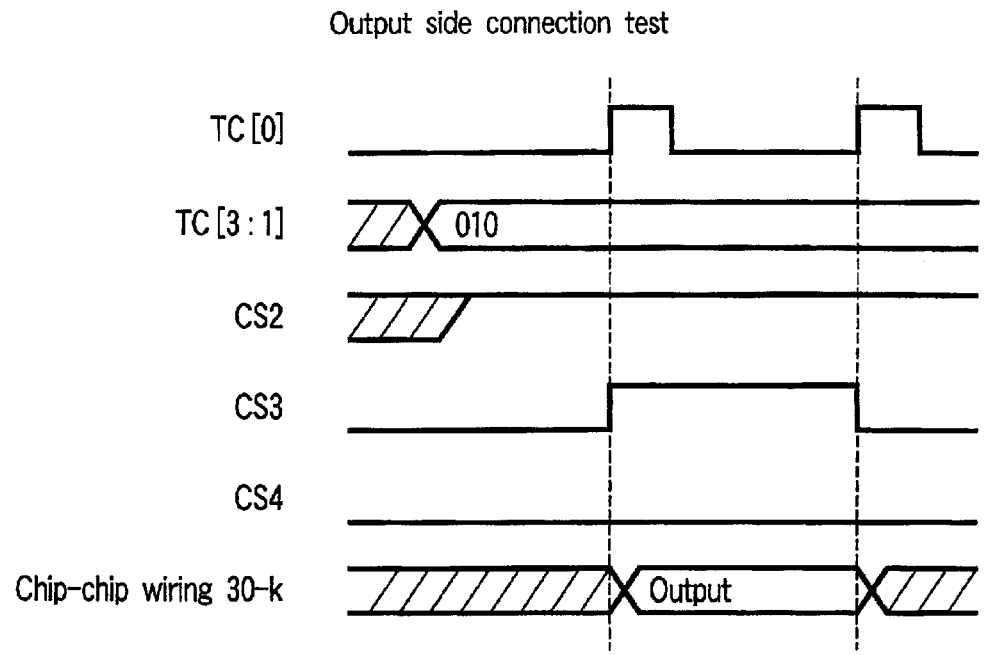
FIG. 10 is a timing chart of various signals, for illustrating an output side connection test in the circuits shown in FIGS. 4 and 5.
Figure 11:
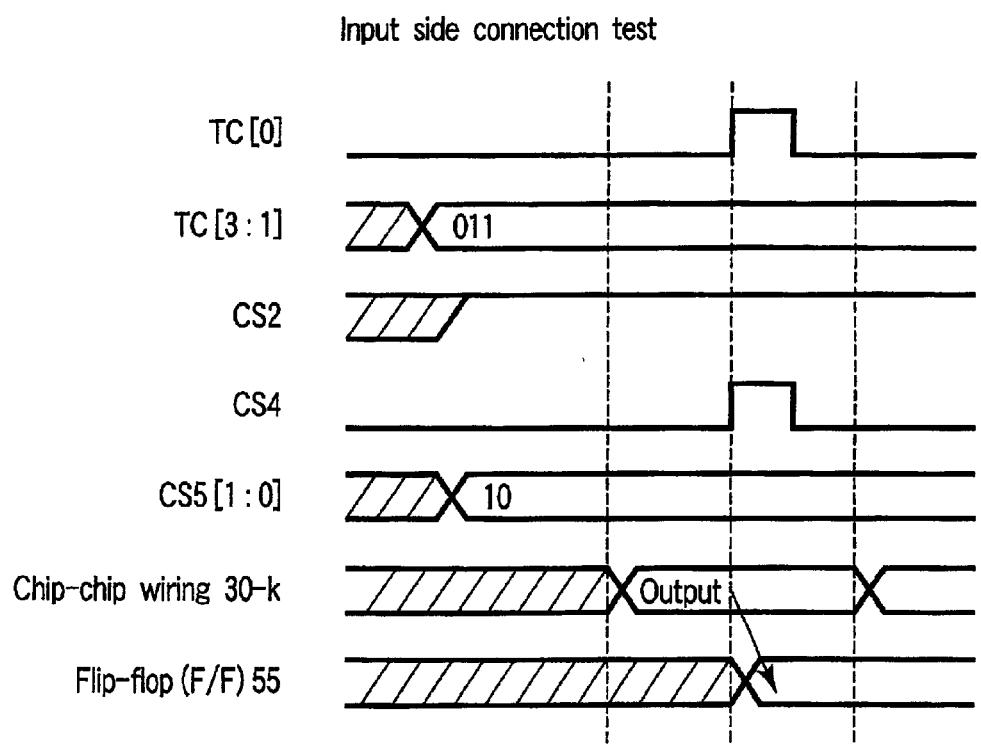
FIG. 11 is a timing chart of various signals, for illustrating an input side connection test in the circuits shown in FIGS. 4 and 5.
Figure 12:
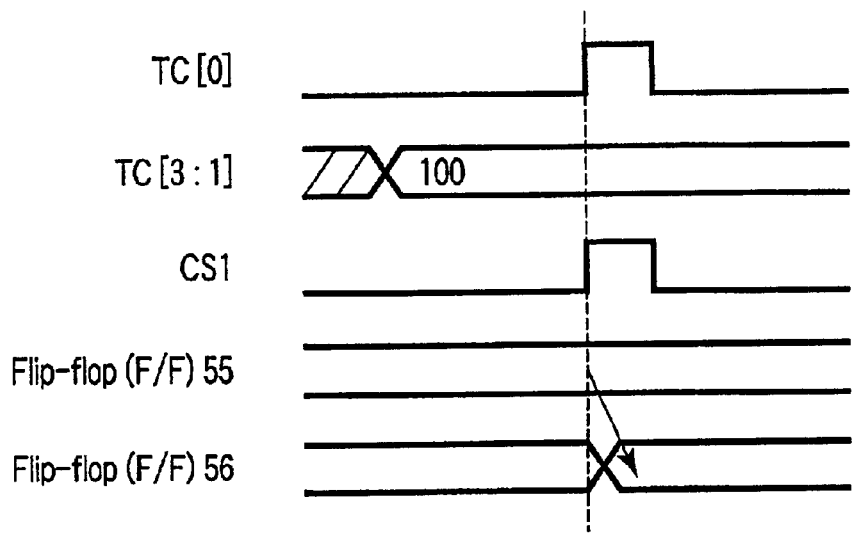
FIG. 12 is a timing chart of various signals, for illustrating a coincidence determination result fetching operation in the circuits shown in FIGS. 4 and 5.
Figure 13:
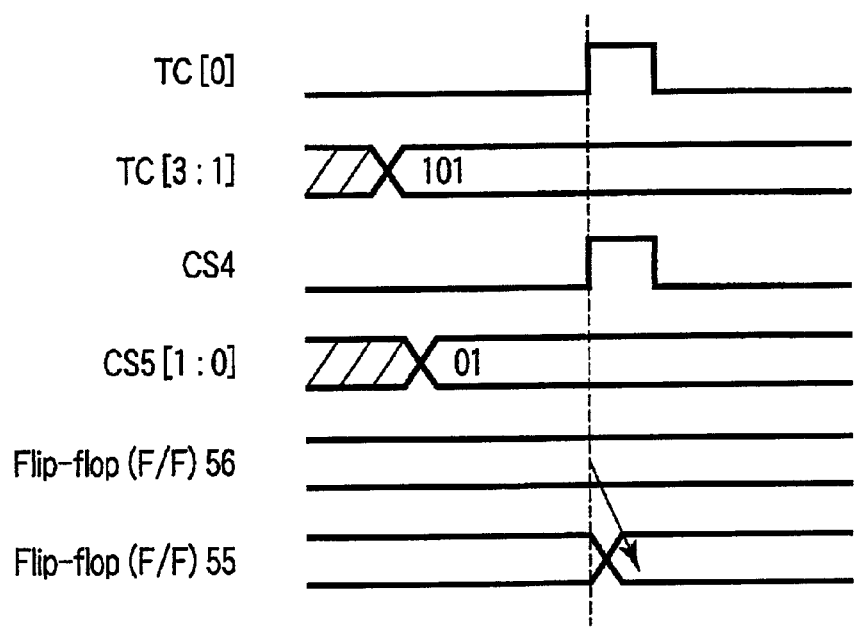
FIG. 13 is a timing chart of various signals, for illustrating a whole test result readout preparing operation in the circuits shown in FIGS. 4 and 5.

FIGS. 8 to 13 are timing charts for illustrating operations of the controller 50 and the circuits controlled by the controller 50. FIG. 8 shows the test reset operation, FIG. 9 shows the scan operation, FIG. 10 shows the output side connection test, FIG. 11 shows the input side connection test, FIG. 12 shows the operation for fetching the coincidence determination result, and FIG. 13 shows the preparation operation for readout of all of the test results.

In the above test setting example, if the test control signal TC[3:1] output from the connection test control circuit 14 is set to "111" as shown in the timing chart of FIG. 8, the flip-flops 56, 76 in the output side chip and input side chip are reset to have the initial values (test reset, set to "0" from the unsettled state) by the controllers 50, 70 in the respective connection test circuits 40B-k (k=1 to j), 40B-r (STEP1a, STEP1b).

Next, the scanning operation of the first cycle is performed for the output side chip and input side chip to fetch test data (STEP2a, STEP2b). In this case, test data is transferred from the connection test control circuit 14 to the flip-flops 56, 76 of all of the connection test circuits 40B-k, 40B-r by a test scan input signal TSI and test scan output signal TSO transferred on the scan paths 44A-1 to 44A-j and 44B-1 to 44B-j. That is, as shown in the timing chart of FIG. 9, if the test control signal TC[3:1] output from the connection test control circuit 14 is set to "001", the connection is changed as follows by the control operation of the controllers 50, 70 in the connection test circuits 40B-k, 40B-r. The test control signal TC[0] is output as it is from the output terminal c4 of each of the controllers 50, 70. Further, "01" is output from the output terminal c5, and as a result, the test scan input signal TSI is supplied to each of the flip-flops 55, 75. If, in this state, the connection test control circuit 14 outputs a clock signal as the test control signal TC[0] and sequentially supplies test data as the test scan input signal TSI in synchronism with the clock signal, then the test data is latched in the flip-flops 55, 75 in all of the connection test circuits 40B-k, 40B-r.

After this, the connection test is made for the output side chip and input side chip (STEP3a, STEP3b). At this time, the test result of the output side chip is transferred to the input side chip and the test result of the input side chip is transferred to the output side chip. Output of the test data to the chip—chip wirings 30-1 to 30-j, 30-r in the output side chip is performed as shown in the timing chart of FIG. 10. If the connection test control circuit 14 outputs the test control signal TC[3:1]="010", a control signal CS2 of "1" level is output from the output terminal c2 of the controller 50 in each of the connection test circuits 40B-k, 40B-r. If the control signal CS2 is set to the "1" level, the connection relation in the circuit is changed by the selectors 52, 53, 61 so that the control signal CS3 will be supplied to the output control terminal of the output buffer 64 and an output of the flip-flop 55 will be supplied to the input terminal of the output buffer 64. At the time of test control signal TC[3:1]= "010", the control signal CS3 is alternately and repeatedly set to "0", "1" in synchronism with a rise of the test control signal TC[0]. Therefore, if the connection test control circuit 14 supplies a pulse to the test control signal TC[0] in this state, the control signal CS3 is set to the "1" level and data of the flip-flop 55 is output to the chip—chip wirings 30-1 to 30-j. Further, if a pulse is supplied once more, the control signal CS3 is set to the "0" level and the output operation is completed.

On the other hand, input of test data from the chip—chip wirings 30-1 to 30-j in the input side chip is performed as shown in the timing chart of FIG. 11. If the connection test control circuit 14 outputs the test control signal TC[3:1]= "011", a control signal CS2 of "1" level is output from the output terminal c2 of the controller 50 in each of the connection test circuits 40B-k, 40B-r and a control signal CS5 of "10" is output from the output terminal c5. If the control signal CS2 is set to the "1" level, an input from the chip—chip wirings 30-1 to 30-j is selected by the selector 62 and an input signal IP (input) is selected by the selector 51 since the control signal CS5 is set at "10". Therefore, a state in which an input signal from the chip—chip wrings 30-1 to 30-j is selected as the input to the flip-flop 55 is attained. Further, at the time of test control signal TC[3:1]="011", the control signal CS4 permits the test control signal TC[0] to be output as it is. Therefore, if the connection test control circuit 14 supplies a pulse to the test control signal TC[0] in this state, an input from the chip—chip wirings 30-1 to 30-j is latched in the flip-flop 55.

Next, the second scan operation is performed, then the test results in the output side chip and input side chip are compared and readout of the test result and writing of the coincidence determination result are performed (STEP4a, STEP4b). That is, test results are read out from the flip-flops 55, 75 of all of the connection test circuits 40B-k, 40B-r by transferring the test scan input signal TSI and test scan output signal TSO onto the scan paths 44A-1 to 44Aj and 44B-1 to 44B-j. At the same time as the test result is read out, whether or not data items of both of the chips coincide with each other, in other words, whether or not data has been correctly transferred is determined in the coincidence determination circuit 16 in the connection test control circuit 14. Then, the results of determination are sequentially written into the flip-flops 55, 75 in the connection test circuits 40B-k, 40B-r after input of the test scan input signal TSI. For example, "0" is written into the flip-flops 55, 75 at the time of coincidence and "1" is written at the time of non-coincidence.

Therefore, the second scan operation itself is the same as the first scan operation and is different from the latter only in that the result of coincidence determination is input instead of test data after input of the test scan input signal TSI.

Next, the result of coincidence determination is fetched (STEP5a, STEP5b). At this time, the result of coincidence determination held in the flip-flop 55, 75 in each of the connection test circuits 40B-k, 40B-r in STEP4a, STEP4b is fetched into the flip-flop 56, 76. As shown in the timing chart of FIG. 12, if the connection test control circuit 14 outputs the test control signal TC[3:1]="100", a test control signal TC[0] is output as it is from the output terminal c1 of each of the controllers 50, 70 in the connection test circuits 40B-k, 40B-r. If the connection test control circuit 14 supplies a pulse which acts as the test control signal TC[0] in this state, the logical OR of values held in the flip-flops 55 and 56 is derived by the OR gate 54 and latched in the flip-flop 56.

After this, setting of the test is changed and the operation from STEP2a, STEP2b to STEP5a, STEP5b is repeatedly performed by a required number of times (STEP6). For example, if eight types of settings are provided as shown by the items (1) to (8) as described before, the operation is repeatedly performed by eight times.

At this time, the test operation may be not performed for wirings which are not bi-directionally connected at the time of test setting in the input/output direction which cannot be coped with. In other words, only the wirings that can be coped with are tested.

Control for the above series of operations is performed by the connection test control circuit 14 shown in FIG. 2 and the controller 50 in the connection test circuit 40B-i (or 40A-i) shown in FIG. 4.

Next, preparation for readout of all of the test results in the output side chip and input side chip is made (STEP7a, STEP7b). The preparation is made by reading out the values held in the flip-flops 56 into the flip-flops 55 in order to read out all of the test results. If the connection test control circuit 14 outputs the test control signal TC[3:1]="101", "01" is output from the output terminal c5 of each of the controllers 50, 70 in the connection test circuits 40B-j, 40B-r. Since the control signal CS5 is set to "01", output signals of the flip-flops 56, 76 are selected by the selector 51, 71. Further, at the time of test control signal TC[3:1]="101", the control signal CS4 permits the test control signal TC[0] to be output as it is. Therefore, if the connection test control circuit 14 supplies a pulse to the test control signal TC[0] in this state, the values held in the flip-flops 56, 76 are latched in the flip-flop 55, 75.

Then, the third scan operation is performed to read out all of the test results and determine pass/fail (STEP8a, STEP8b) and the test is terminated. That is, the test results are read out from the flip-flops 55, 75 of all of the connection test circuits 40B-k, 40B-r by use of the test scan input signal TSI and test scan output signal TSO transferred onto the scan paths 44A-1 to 44A-j and 44B-1 to 44B-j. The test results are counted by the connection test circuits 40B-k, 40B-r and the semiconductor system is determined as a fail if two or more wirings of connection failure are detected in the connection rearrange wiring section of one block.

Therefore, the third scan operation itself is the same as the first scan operation.

After this, the connection is rearranged as required based on the test results stored in the test result storage elements 43A-1 to 43A-j, 43A-r, 43B-1 to 43B-j, 43B-r (flip-flops 56).

With the above configuration, in a semiconductor system having a plurality of semiconductor chips interconnected, the rate of occurrence of fails can be lowered.

Further, according to the above test method, in a semiconductor system having a plurality of semiconductor chips interconnected, the system itself can determine pass or fail of the connection.

Next, various modifications of the embodiment described above are explained.

(First Modification)

FIGS. 14 to 17 show various examples of a connection test circuit and connection rearrange circuit which are configured according to a difference in the direction of connection between the main circuit in the chip and the chip—chip wirings. Each of the circuits can be obtained by omitting part of the functions (circuits) from the circuit shown in FIG. 4.

Figure 14:
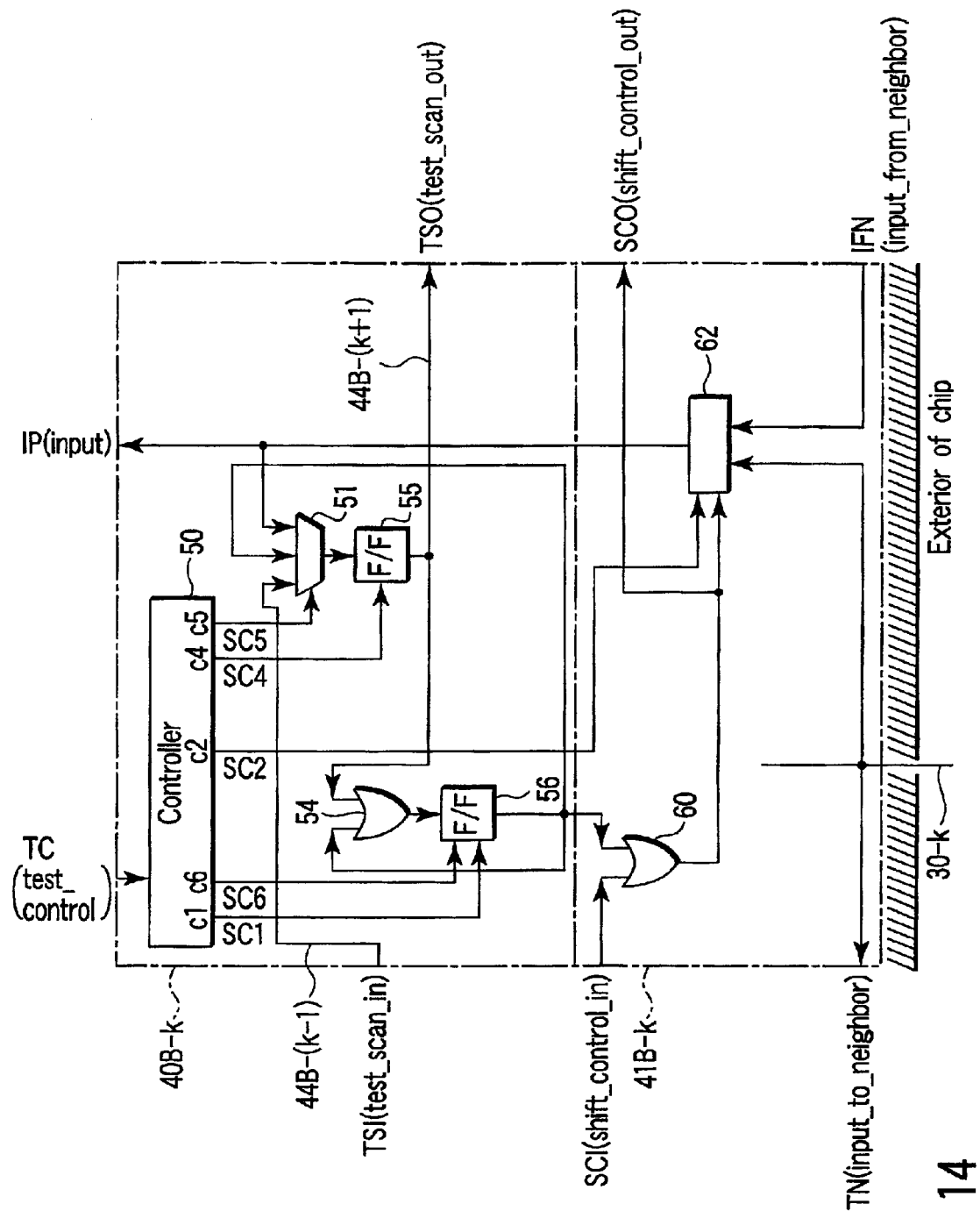
FIG. 14 is a circuit diagram showing a first variation of a connection test circuit and connection rearrange circuit according to a difference in the connection direction of the wiring of the main circuit in a chip and the wirings between the chips.

The connection test circuit 40B-k shown in FIG. 14 includes a controller 50, selector 51, OR gate 54, flip-flops 55, 56. Further, the connection rearrange circuit 41B-k includes an OR gate 60 and selector 62. The connection test circuit 40B-k is obtained by omitting the selectors 52, 53 in the circuit shown in FIG. 4 and the connection rearrange circuit 41B-k is obtained by omitting the selector 61 and output buffers 63, 64.

The connection test circuit 40B-k shown in FIG. 14 makes connection in the input direction with respect to the main circuit in the chip and makes connection in the input direction with respect to the chip—chip wiring.

If bi-directional connection is unnecessary and only the connection in the input direction is made, the circuit configuration can be simplified by using the configuration as shown in FIG. 14.

Figure 15:
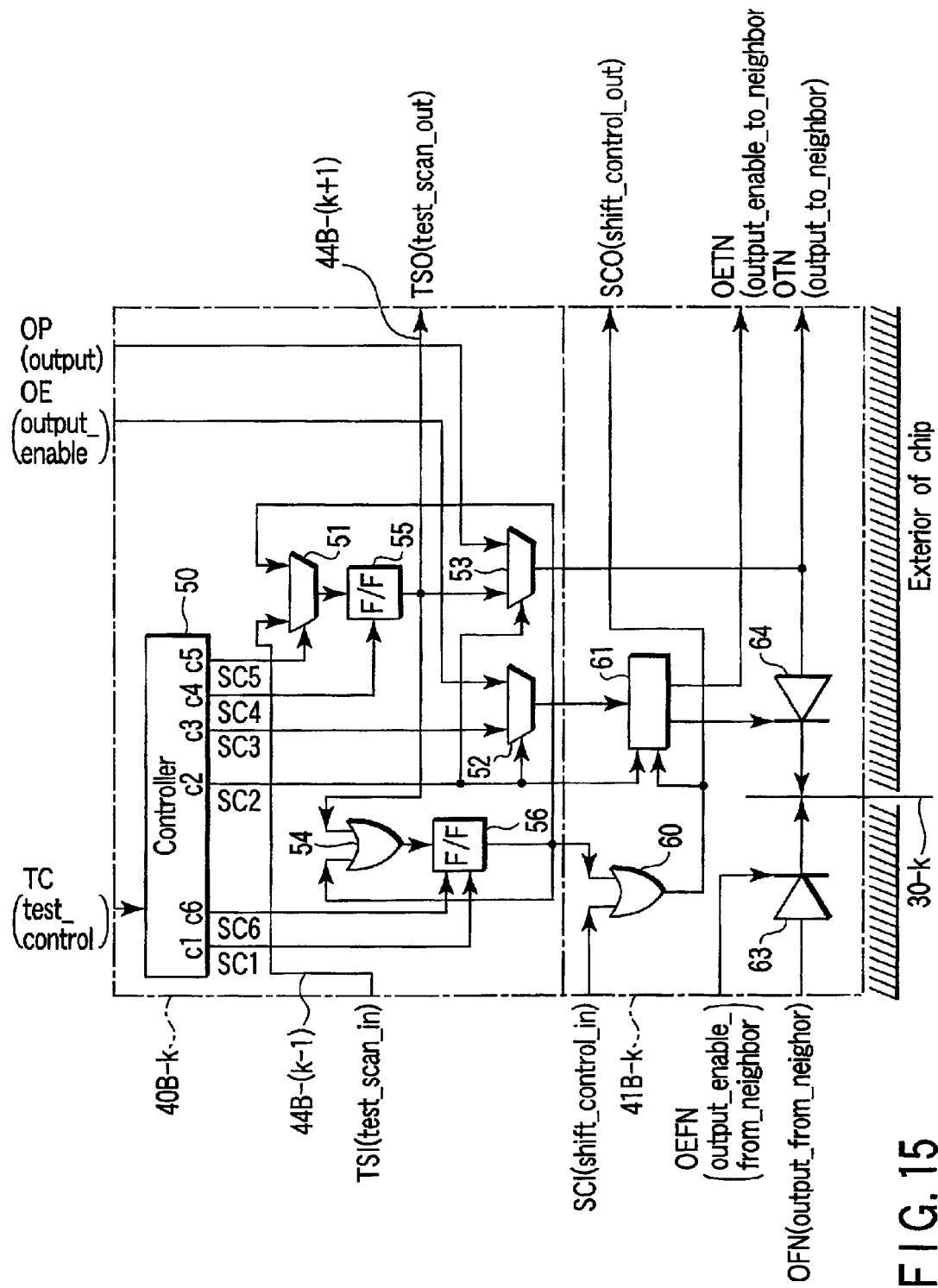
FIG. 15 is a circuit diagram showing a second variation of the connection test circuit and connection rearrange circuit according to a difference in the connection direction of the wiring of the main circuit in a chip and the wirings between the chips.

The connection test circuit 40B-k shown in FIG. 15 includes a controller 50, selectors 51, 52, 53, OR gate 54 and flip-flops 55, 56. Further, the connection rearrange circuit 41B-k includes an OR gate 60, selector 62 and output buffers (tri-state buffers) 63, 64. The above circuit has basically the same configuration as the circuit shown in FIG. 4 except that the connection rearrange circuit 41B-k is configured by omitting the selector 62 and an output of the selector 62 is not supplied to the selector 51 of the connection test circuit 40B-k.

The circuit shown in FIG. 15 makes connection in the output direction with respect to the main circuit in the chip and makes connection in the output direction with respect to the chip—chip wiring.

If bi-directional connection is unnecessary and only the connection in the output direction is made, the circuit configuration can be simplified by using the configuration as shown in FIG. 15.

Figure 16:
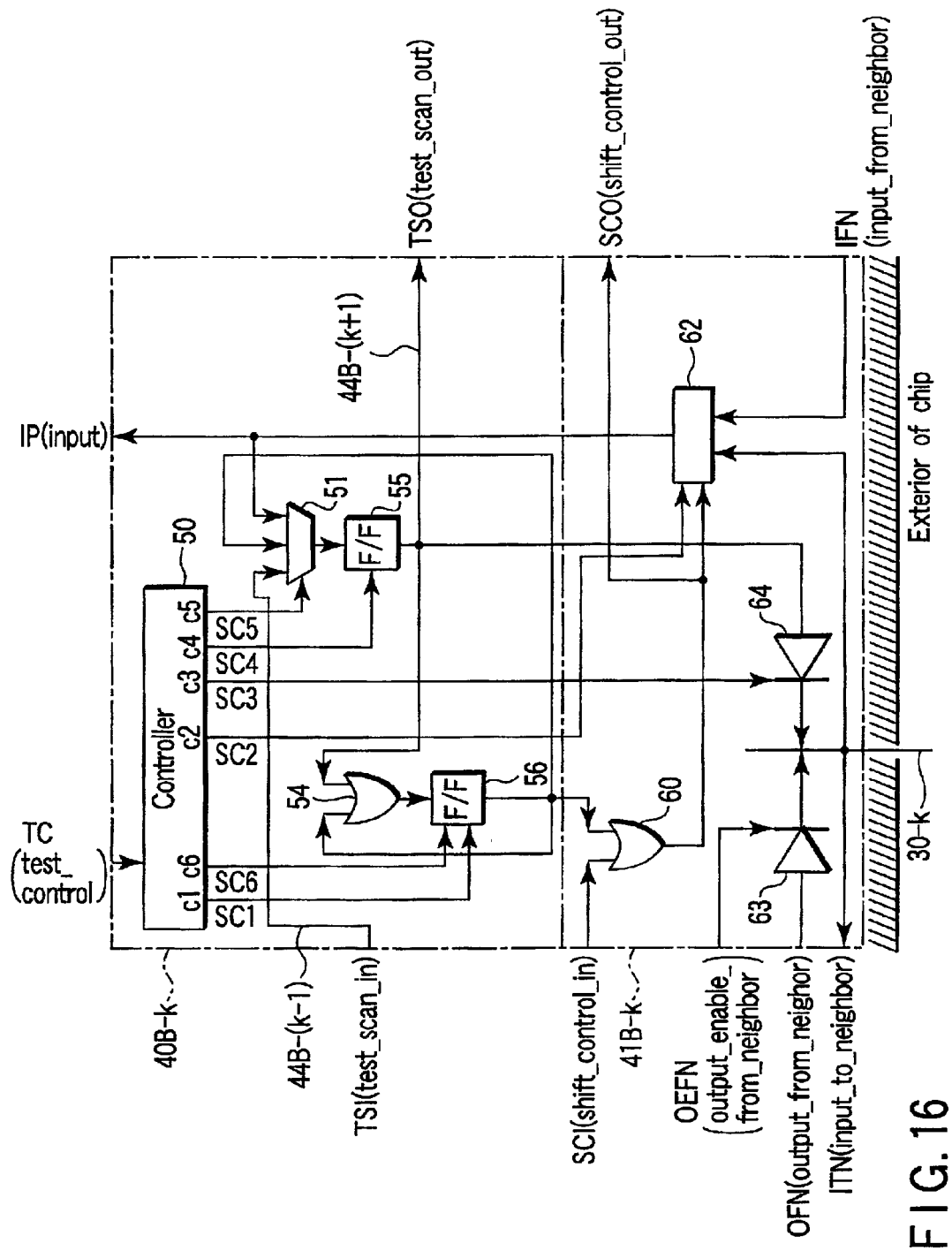
FIG. 16 is a circuit diagram showing a third variation of the connection test circuit and connection rearrange circuit according to a difference in the connection direction of the wiring of the main circuit in a chip and the wirings between the chips.

The connection test circuit 40B-k shown in FIG. 16 includes a controller 50, selector 51, OR gate 54 and flip-flops 55, 56. Further, the connection rearrange circuit 41B-k includes an OR gate 60, selector 62 and output buffers (tri-state buffers) 63, 64. The connection test circuit 40B-k is obtained by omitting the selectors 52, 53 in the circuit shown in FIG. 4 and the connection rearrange circuit 41B-k is obtained by omitting the selector 61.

The circuit shown in FIG. 16 makes connection in the input direction with respect to the main circuit in the chip and makes bi-directional connection with respect to the chip—chip wiring.

If bi-directional connection is unnecessary and only the connection in the input direction is made with respect to the main circuit in the chip, the circuit configuration can be simplified by using the configuration as shown in FIG. 16.

Figure 17:
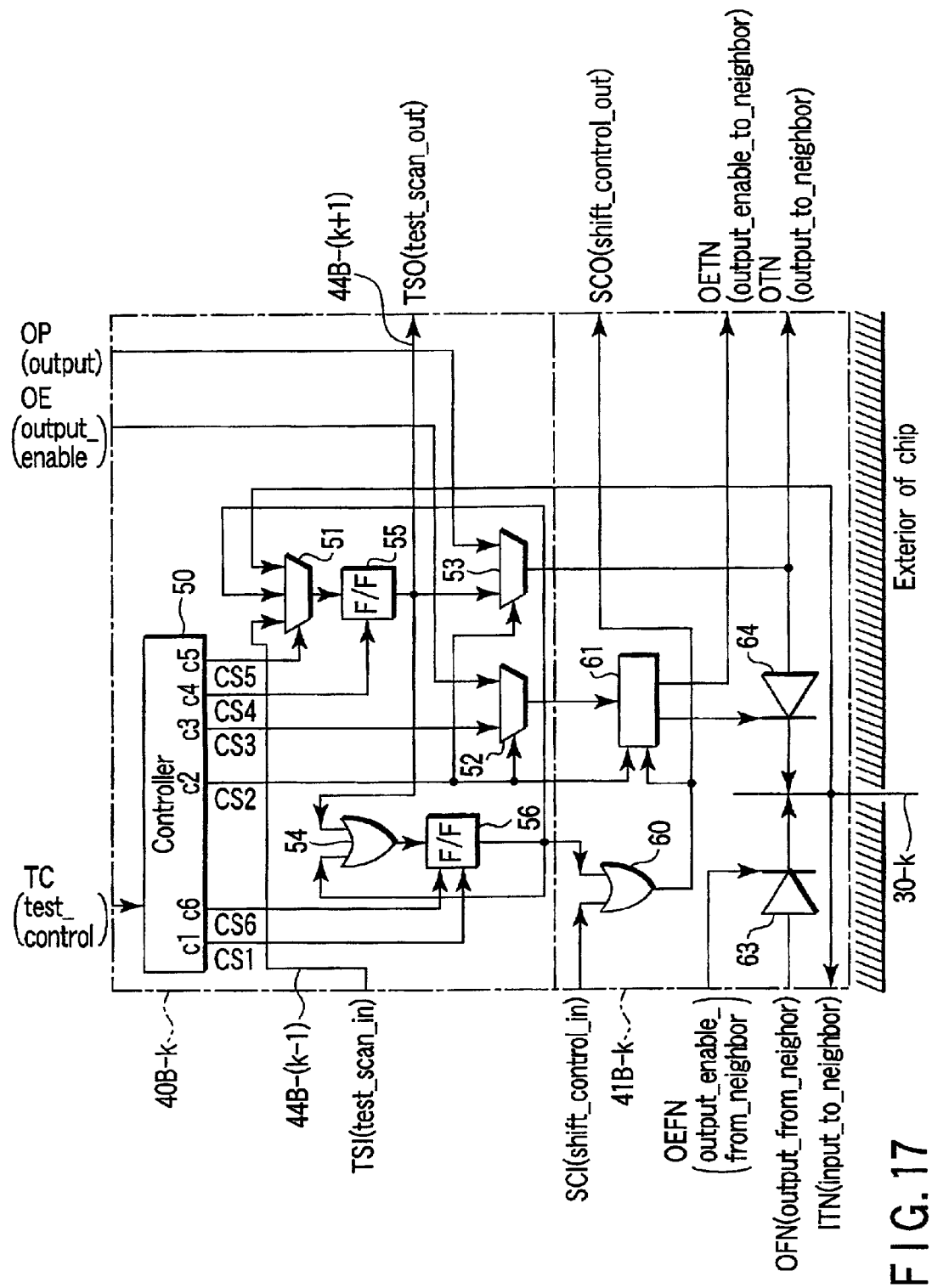
FIG. 17 is a circuit diagram showing a fourth variation of the connection test circuit and connection rearrange circuit according to a difference in the connection direction of the wiring of the main circuit in a chip and the wirings between the chips.

The connection test circuit 40B-k shown in FIG. 17 includes a controller 50, selectors 51, 52, 53, OR gate 54 and flip-flops 55, 56. Further, the connection rearrange circuit 41B-k includes an OR gate 60, selector 61 and output buffers (tri-state buffers) 63, 64. The connection test circuit 40B-k has substantially the same configuration as the circuit shown in FIG. 4 and the connection rearrange circuit 41B-k is obtained by omitting the selector 61.

The circuit shown in FIG. 17 makes connection in the output direction with respect to the main circuit in the chip and makes connection in the input direction with respect to the chip—chip wiring.

If bi-directional connection is unnecessary and only the connection in the output direction is made with respect to the main circuit in the chip, the circuit configuration can be simplified by using the configuration as shown in FIG. 17.

FIGS. 18 and 19 are show other examples of the configuration of the connection test circuit and connection rearrange circuit for redundancy wiring shown in FIG. 5 in the connection rearrange wiring section. The above circuit is obtained by omitting part of the function (circuit) from the circuit shown in FIG. 5. With the above configuration, basically, part of the function and part of the effect obtained in the semiconductor system according to the above embodiment can be attained.

The connection test circuit 40B-r shown in FIG. 18 includes a controller 70, selector 71, OR gate 74 and flip-flops 75, 76. Further, the connection rearrange circuit 41B-r includes a wiring used to supply a signal input to the chip—chip wiring 30-k to the preceding-stage connection rearrange circuit 41B-j and a wiring used to supply the signal to the selector 71. The connection test circuit 40B-r has substantially the same configuration as the circuit shown in FIG. 5 and the connection rearrange circuit 41B-r is obtained by omitting the output buffers 83, 84.

The circuit shown in FIG. 18 has the chip—chip wiring connected in the input direction from the exterior of the chip to the interior of the chip.

If bi-directional connection is unnecessary and only the connection in the input direction is made, the circuit configuration can be simplified by using the configuration as shown in FIG. 18.

The connection test circuit 40B-r shown in FIG. 19 includes a controller 70, selector 71, OR gate 74 and flip-flops 75, 76. Further, the connection rearrange circuit 41B-r includes output buffers (tri-state buffers) 83, 84. The connection rearrange circuit 41B-r includes a wiring used to supply a signal input to the chip—chip wiring 30-k to the preceding-stage connection rearrange circuit 41B-j and the wiring used to supply the signal to the selector 71 is omitted. The connection test circuit 40B-r has basically the same circuit configuration as the circuit shown in FIG. 5 and is different only in that the signal is not supplied to the selector 71 via the above wiring and chip—chip wiring 30-r.

The circuit shown in FIG. 19 has the chip—chip wiring connected in the output direction from the interior of the chip to the exterior of the chip.

If bi-directional connection is unnecessary and only the connection in the output direction is made, the circuit configuration can be simplified by using the configuration as shown in FIG. 19.

The connection test circuit and connection rearrange circuit can be attained by adequately combining the circuits shown in FIGS. 3 and 4 or the circuits shown in FIGS. 14 to 19 as required.

(Second Modification)

Next, various modifications of the arrangement of the connection test control circuit of the above embodiment are explained with reference to FIGS. 20 to 36.

Figure 20:
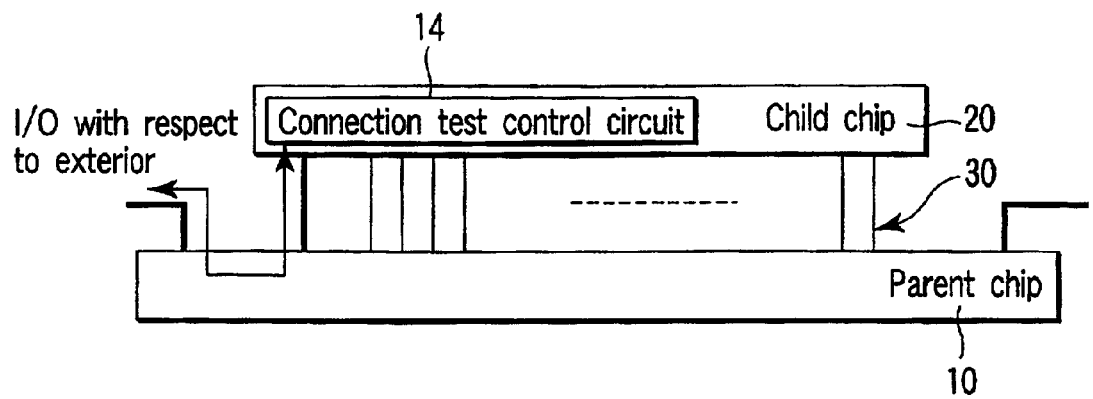
FIG. 20 is a schematic view for illustrating a first modification of the arrangement of a connection test control circuit according to the embodiment of the present invention.

In the above embodiment, the connection test control circuit 14 is provided in the parent chip 10, but in an example shown in FIG. 20, the connection test control circuit 14 is provided in the child chip 20. A control signal input from the external I/O terminal of the parent chip 10 is supplied to the connection test control circuit 14 in the child chip 20 via an interconnection layer and the wiring 30 formed on the parent chip 10. Like the circuit shown in FIG. 2, the connection test control circuit 14 includes a test data generating circuit 15, coincidence determination circuit 16 and selectors 17, 18. The connection test circuits and connection rearrange circuits in the blocks 12-1 to 12-n configuring the connection rearrange wiring section 12 are controlled by the connection test control circuit 14.

Figure 21:
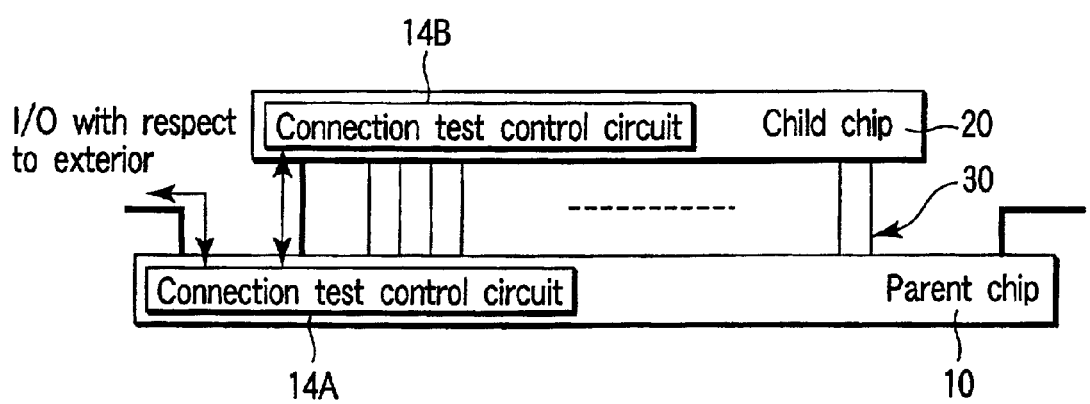
FIG. 21 is a schematic view for illustrating a second modification of the arrangement of the connection test control circuit according to the embodiment of the present invention.

In an example shown in FIG. 21, the connection test control circuit 14 is provided in the parent chip 10 and child chip 20. The connection test control circuit 14 has a portion 14A of the configuration shown in FIG. 2 provided in the parent chip 10 and the remaining portion 14B provided in the child chip 20. The connection test circuits and connection rearrange circuits in the blocks 12-1 to 12-n configuring the connection rearrange wiring section 12 are controlled by the connection test control circuits 14A, 14B.

Thus, the connection test control circuit is divided and arranged on a plurality of chips, data decoded in one of the circuits may be transmitted and the data is encoded on the receiving side, and the configuration can be freely made as required.

Figure 22:
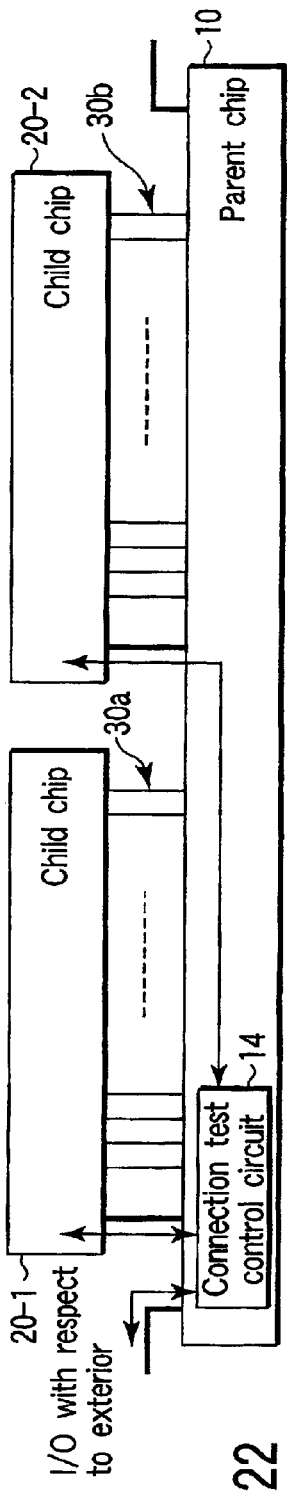
FIG. 22 is a schematic view for illustrating a third modification of the arrangement of the connection test control circuit according to the embodiment of the present invention.

In an example shown in FIG. 22, a plurality of child chips 20-1, 20-2 are mounted on the parent chip 10 and the connection test control circuit 14 is provided in the parent chip 10. A control signal input via the external I/O terminal of the parent chip 10 is supplied to the connection test control circuit 14 provided on the parent chip 10 and supplied to the child chips 20-1, 20-2 via wirings 30a, 30b. The connection test circuits and connection rearrange circuits in the blocks which configure connection rearrange wiring sections respectively provided in the parent chip 10 and plural child chips 20-1, 20-2 are controlled by the connection test control circuit 14.

Figure 23:
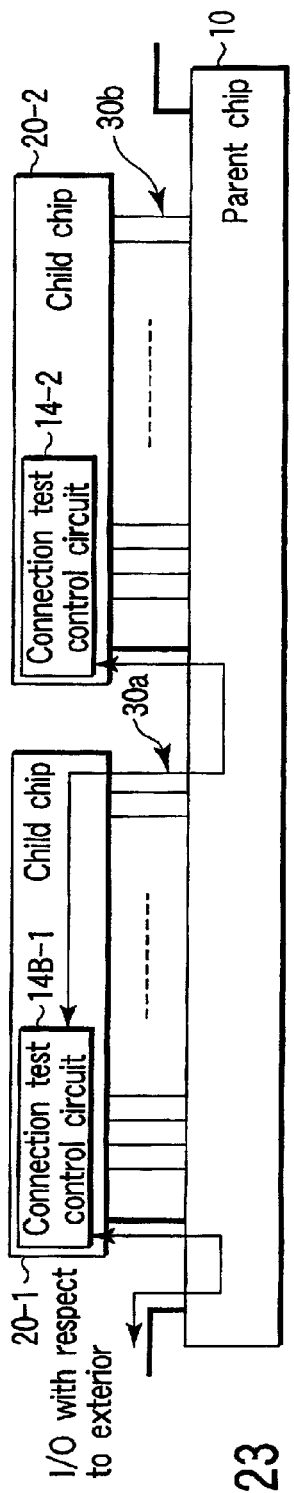
FIG. 23 is a schematic view for illustrating a fourth modification of the arrangement of the connection test control circuit according to the embodiment of the present invention.

In an example shown in FIG. 23, a plurality of child chips 20-1, 20-2 are mounted on the parent chip 10 and the connection test circuits and connection rearrange circuits in the blocks which configure connection rearrange wiring sections respectively provided in the parent chip 10 and plural child chips 20-1, 20-2 are controlled by connection test control circuits 14-1, 14-2 respectively formed in the child chips 20-1, 20-2.

Figure 24:
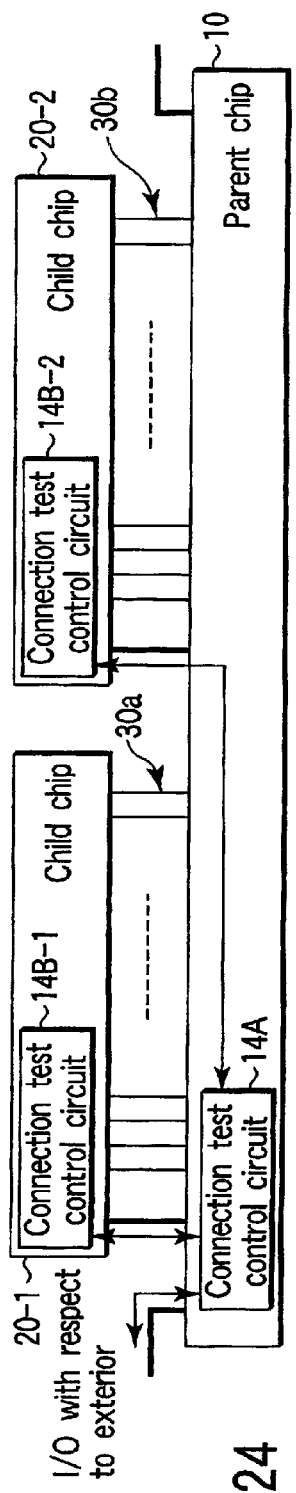
FIG. 24 is a schematic view for illustrating a fifth modification of the arrangement of the connection test control circuit according to the embodiment of the present invention.

In an example shown in FIG. 24, a plurality of child chips 20-1, 20-2 are mounted on the parent chip 10 and the connection test circuits and connection rearrange circuits in the blocks which configure connection rearrange wiring sections respectively provided in the parent chip 10 and plural child chips 20-1, 20-2 are controlled by connection test control circuits 14A, 14B-1, 14B-2 respectively formed in the parent chip 10 and child chips 20-1, 20-2.

In an example shown in FIG. 25, a plurality of child chips 20-1, 20-2 are mounted in a stacked form on the parent chip 10 and the connection test control circuit 14 is provided in the parent chip 10. A control signal input via the external I/O terminal of the parent chip 10 is supplied to the connection test control circuit 14 provided on the parent chip 10 and supplied to the child chips 20-1, 20-2 via wirings 30a, 30b. As the wiring 30A, for example, a bump and a metal plug buried in a through hole formed in the child chip 20-1 are used. With the above configuration, a signal can be transferred between the child chip 20-2 and the connection test control circuit 14 formed in the parent chip 10 via the child chip 20-1. The connection test circuits and connection rearrange circuits in the blocks which configure connection rearrange wiring sections respectively provided in the parent chip 10 and plural child chips 20-1, 20-2 are controlled by the connection test control circuit 14.

Further, in an example shown in FIG. 26, a plurality of child chips 20-1, 20-2 are mounted in a stacked form on the parent chip 10 and the connection test circuits and connection rearrange circuits in the blocks which configure connection rearrange wiring sections respectively provided in the parent chip 10 and plural child chips 20-1, 20-2 are controlled by connection test control circuits 14-1, 14-2 respectively provided in the child chips 20-1, 20-2.

In an example shown in FIG. 27, a plurality of child chips 20-1, 20-2 are mounted in a stacked form on the parent chip 10 and the connection test circuits and connection rearrange circuits in the blocks which configure connection rearrange wiring sections respectively provided in the parent chip 10 and plural child chips 20-1, 20-2 are controlled by connection test control circuits 14A, 14B-1, 14B-2 respectively provided in the parent chip 10 and child chips 20-1, 20-2.

In the modifications of FIGS. 20 to 27, the connection test control circuit is provided in one or both of the parent chip 10 and child chip 20. However, as shown in FIGS. 8 to 36, the connection test control circuit can be provided in the exterior of the chip or in at least one of the exterior of the chip and the parent chip 10 or child chip 20.

In an example shown in FIG. 28, the connection test control circuit (or connection test control device) 14 is provided outside the chip. A control signal output from the connection test control circuit 14 is input via the external I/O terminal of the parent chip 10 and supplied to the child chip 20 via an interconnection layer and the wiring 30 formed on the parent chip 10. Like the circuit shown in FIG. 2, the connection test control circuit 14 includes a test data generating circuit 15, coincidence determination circuit 16 and selectors 17, 18. The connection test circuits and connection rearrange circuits in the blocks which configure connection rearrange wiring sections respectively provided in the parent chip 10 and child chip 20 are controlled by the connection test control circuit 14.

In an example shown in FIG. 29, connection test control circuits are respectively provided outside the chip and in the child chip 20. A control signal output from the connection test control circuit 14 is input via the external I/O terminal of the parent chip 10 and supplied to the connection test control circuit 14B of the child chip 20 via an interconnection layer and the wiring formed on the parent chip 10. The connection test circuits and connection rearrange circuits in the blocks which configure connection rearrange wiring sections respectively provided in the parent chip 10 and child chip 20 are controlled by the connection test control circuits 14, 14B.

In an example shown in FIG. 30, connection test control circuits are respectively provided outside the chip and in the parent chip 10 and child chip 20. A control signal output from the connection test control circuit 14 is input to the connection test control circuit 14A of the parent chip 10 via the external I/O terminal and supplied to the connection test control circuit 14B of the child chip 20 via the wiring. The connection test circuits and connection rearrange circuits in the blocks which configure connection rearrange wiring sections respectively provided in the parent chip 10 and child chip 20 are controlled by the connection test control circuits 14, 14A, 14B.

Figure 31:
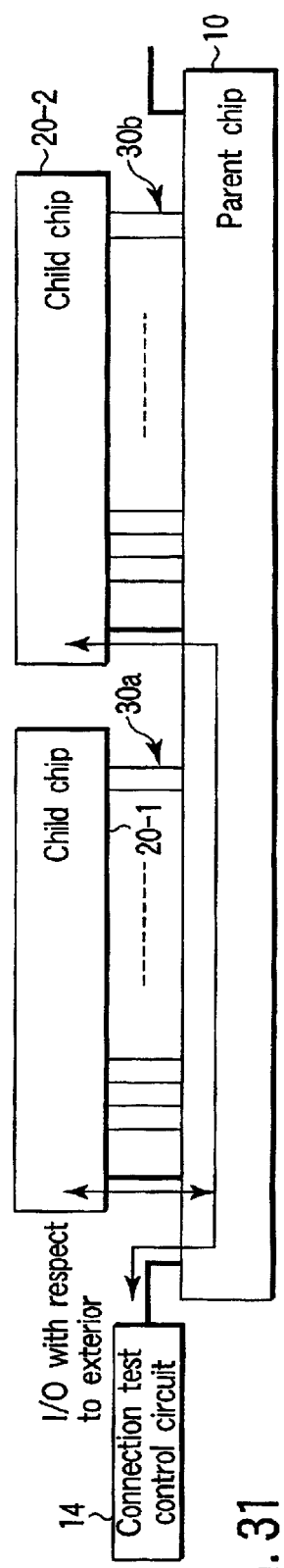
FIG. 31 is a schematic view for illustrating a twelfth modification of the arrangement of the connection test control circuit according to the embodiment of the present invention.

In an example shown in FIG. 31, a plurality of child chips 20-1, 20-2 are mounted on the parent chip 10 and the connection test circuits and connection rearrange circuits in the blocks which configure connection rearrange wiring sections respectively provided in the parent chip 10 and plural child chips 20-1, 20-2 are controlled by the connection test control circuit 14 provided outside the chip.

Figure 32:
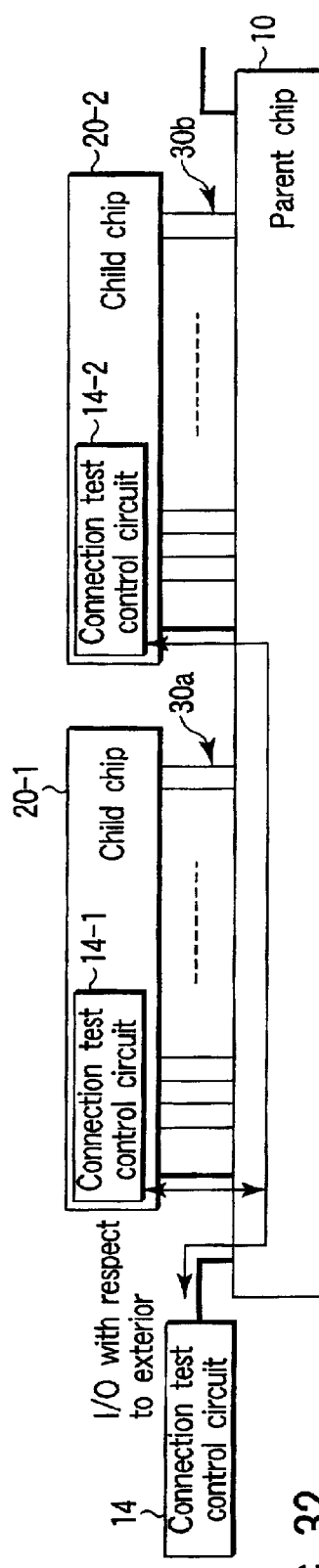
FIG. 32 is a schematic view for illustrating a thirteenth modification of the arrangement of the connection test control circuit according to the embodiment of the present invention.

Further, in an example shown in FIG. 32, a plurality of child chips 20-1, 20-2 are mounted on the parent chip 10 and the connection test circuits and connection rearrange circuits in the blocks which configure connection rearrange wiring sections respectively provided in the parent chip 10 and plural child chips 20-1, 20-2 are controlled by connection test control circuits 14, 14-1, 14-2 provided outside the chip and in the child chips 20-1, 20-2.

Figure 33:
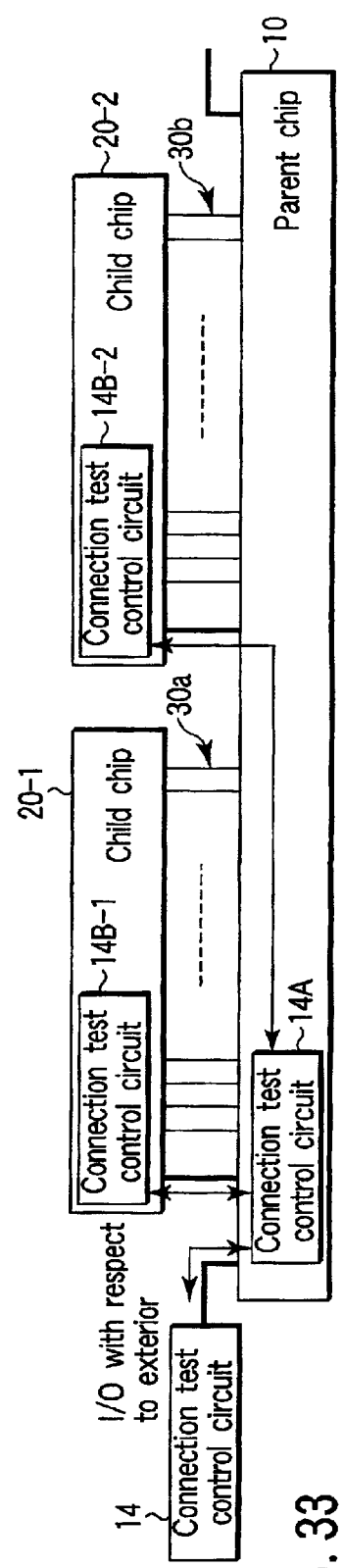
FIG. 33 is a schematic view for illustrating a fourteenth modification of the arrangement of the connection test control circuit according to the embodiment of the present invention.

In an example shown in FIG. 33, a plurality of child chips 20-1, 20-2 are mounted on the parent chip 10 and the connection test circuits and connection rearrange circuits in the blocks which configure connection rearrange wiring sections respectively provided in the parent chip 10 and plural child chips 20-1, 20-2 are controlled by connection test control circuits 14, 14A, 14B-1, 14B-2 provided outside the chip and in the parent chip 10 and child chips 20-1, 20-2.

In an example shown in FIG. 34, a plurality of child chips 20-1, 20-2 are mounted in a stacked form on the parent chip 10 and the connection test circuits and connection rearrange circuits in the blocks which configure connection rearrange wiring sections respectively provided in the parent chip 10 and plural child chips 20-1, 20-2 are controlled by the connection test control circuit 14 provided outside the chip.

In an example shown in FIG. 35, a plurality of child chips 20-1, 20-2 are mounted in a stacked form on the parent chip 10 and the connection test circuits and connection rearrange circuits in the blocks which configure connection rearrange wiring sections respectively provided in the parent chip 10 and plural child chips 20-1, 20-2 are controlled by connection test control circuits 14, 14-1, 14-2 provided outside the chip and in the child chips 20-1, 20-2.

In an example shown in FIG. 36, a plurality of child chips 20-1, 20-2 are mounted in a stacked form on the parent chip 10 and the connection test circuits and connection rearrange circuits in the blocks which configure connection rearrange wiring sections respectively provided in the parent chip 10 and plural child chips 20-1, 20-2 are controlled by connection test control circuits 14, 14A, 14B-1, 14B-2 provided outside the chip and in the parent chip 10 and child chips 20-1, 20-2.

With the above configuration, basically, the same effect and operation as in those of the embodiment described before can be attained. Further, as shown in FIGS. 28 to 36, if the connection test control circuit (test data generating circuit and coincidence determination circuit) is arranged outside the semiconductor system and a connection test is made by use of the external I/O, the configuration of the semiconductor system can be simplified.

In the examples shown in FIGS. 22 to 27 and FIGS. 31 to 35, a case wherein the two child chips 20-1, 20-2 are mounted on the parent chip 10 is explained, but it is of course possible to cope with a case wherein three or more child chips are mounted.

Further, in the modifications shown in FIGS. 20 to 36, the configurations shown in FIGS. 3, 4, 14 to 19 can be applied to the connection test circuit and connection rearrange circuit.

(Third Modification)

Figure 37:
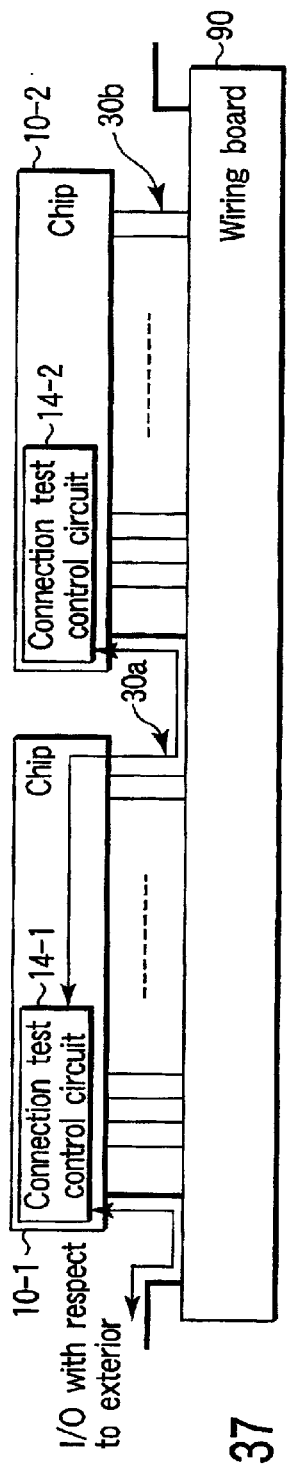
FIG. 37 is a schematic view for illustrating another example of the semiconductor system according to the embodiment of the present invention.
Figure 38:
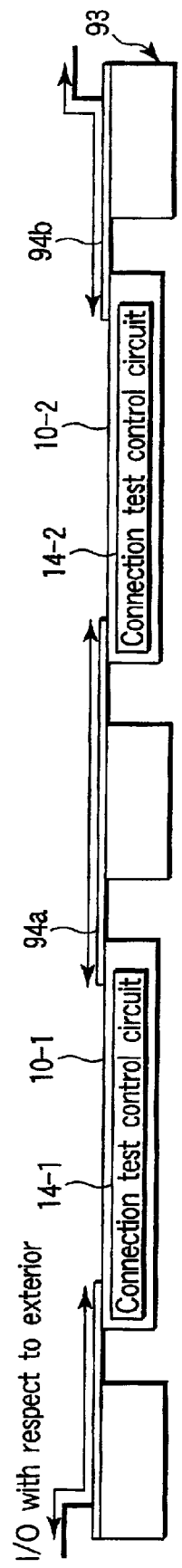
FIG. 38 is a schematic view for illustrating still another example of the semiconductor system according to the embodiment of the present invention.

FIGS. 37 and 38 are schematic views for illustrating other examples of the semiconductor system according to the embodiment of the present invention. In the above embodiment and the modifications thereof, a semiconductor system in which one or more semiconductor chips (child chips) are mounted on a semiconductor chip (parent chip) is explained as an example. However, in the example shown in FIG. 37, a plurality of semiconductor chips 10-1, 10-2 are mounted on a wiring board 90 by use of wirings 30a, 30b. Connection test control circuits 14-1, 14-2 are provided in the semiconductor chips 10-1, 10-2 and electrically connected to each other via the wirings 30a, 30b and a wiring pattern on the wiring board 90. The connection test for the wirings 30a, 30b which connect the semiconductor chips 10-1, 10-2 with the wiring pattern on the wiring board 90 is made and when poor connection (or connection failure) occurs, correction of the poor connection (compensation for the fail) is made.

Further, in an example shown in FIG. 38, a plurality of semiconductor chips 10-1, 10-2 are mounted on a TAB tape 93. Connection test control circuits 14-1, 14-2 are respectively provided in the semiconductor chips 10-1, 10-2 and electrically connected to each other via leads 94a, 94b. The test for connection between the semiconductor chips 10-1, 10-2 and the leads 94a, 94b is made and when poor connection occurs, correction of the poor connection (compensation for the fail) is made.

As described above, the semiconductor system in which a plurality of semiconductor chips 10-1, 10-2 are mounted on the wiring board 90 or a plurality of semiconductor chips 10-1, 10-2 are mounted on the TAB tape 93 is basically the same as the semiconductor system in which one or a plurality of semiconductor chips are mounted on the semiconductor chip as explained in the above embodiment and the modification thereof and can attain substantially the same operation and effect.

In the examples shown in FIGS. 37 and 38, a case wherein the connection test control circuits 14-1, 14-2 are respectively provided in the semiconductor chips 10-1, 10-2 is explained, but the connection test control circuit may be formed in one of the chips or provided outside the chip as explained in the second modification. Of course, the connection test control circuits may be provided in and outside the chip.

(Fourth Modification)

FIGS. 39 to 43 show various examples of wirings to be corrected (compensated for).

Figure 39:
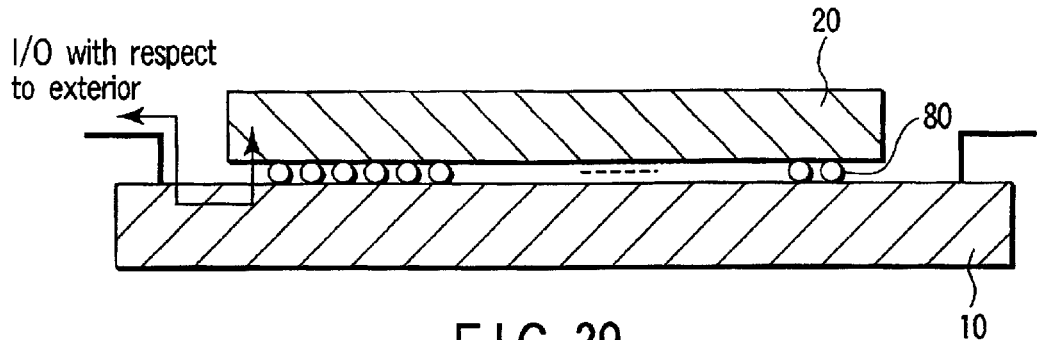
FIG. 39 is a cross sectional view showing a first example of a wiring to be corrected in the embodiment of the present invention.

In an example shown in FIG. 39, the parent chip 10 and child chip 20 are arranged with the element forming surfaces thereof set to face each other and electrodes of the parent chip 10 and child chip 20 are mounted by use of bumps 80 by a flip chip interconnection method. The bumps 80 correspond to the wirings 30-1 to 30-$j$, 30-$r$, 31, 32, 33 in the circuit shown in FIGS. 2 and 3 and when poor connection occurs in any one of the wirings 30-1 to 30-$j$, compensation for the poor connection is made by use of the wiring 30-$r$.

Figure 40:
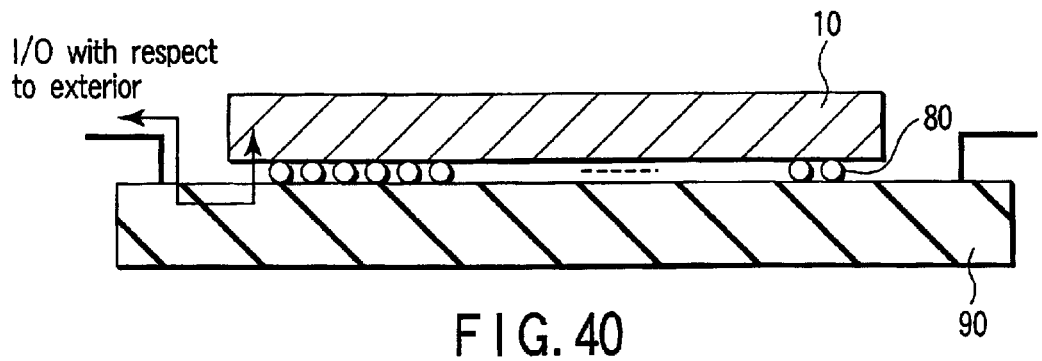
FIG. 40 is a cross sectional view showing a second example of a wiring to be corrected in the embodiment of the present invention.

FIG. 40 shows a case wherein the semiconductor chip 10 is mounted on the wiring board 90 by use of bumps 80 by a flip chip interconnection method. The bumps 80 basically correspond to the wirings 30-1 to 30-$j$, 30-$r$, 31, 32, 33 in the circuit shown in FIGS. 2 and 3 and when poor connection occurs in any one of the wirings 30-1 to 30-$j$, compensation for the poor connection is made by use of the wiring 30-$r$.

With this configuration, it is necessary to provide the connection test control circuit in the semiconductor chip 10 or outside the system. Of course, the connection test control circuit can be provided both in the semiconductor chip and outside the system. Further, since the connection rearrange wiring section is provided only in the semiconductor chip 10, it becomes necessary to make selective connections to the wirings when the wiring board 90 is connected to the external I/O.

With the above configuration, basically, the same operation and effect as those in the above embodiment and the modifications thereof can be attained.

Figure 41:
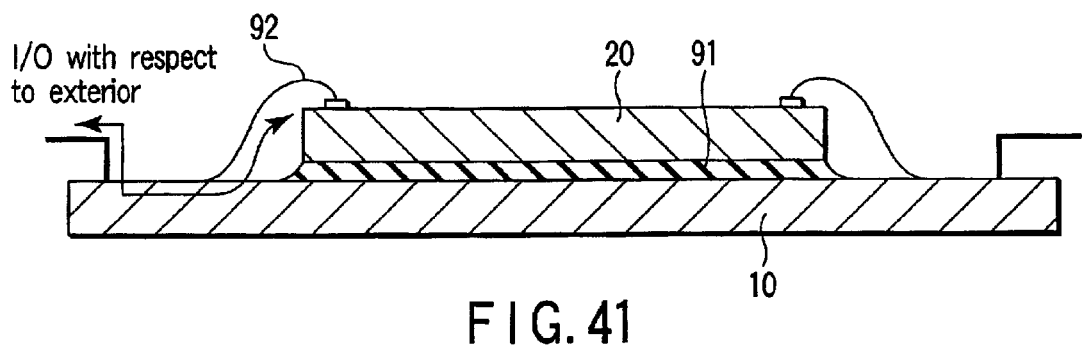
FIG. 41 is a cross sectional view showing a third example of a wiring to be corrected in the embodiment of the present invention.

In an example shown in FIG. 41, the rear surface of the child chip 20 is mounted on the element forming surface of the parent chip 10 with an insulating layer 91 disposed therebetween and electrodes of the parent chip 10 and child chip 20 are mounted and connected by use of bonding wires 92. The bonding wires 92 correspond to the wirings 30-1 to 30-$j$, 30-$r$, 31, 32, 33 in the circuit shown in FIGS. 2 and 3 and when poor connection occurs in any one of the wirings 30-1 to 30-$j$, the poor connection is compensated for by use of the wiring 30-$r$.

Figure 42:
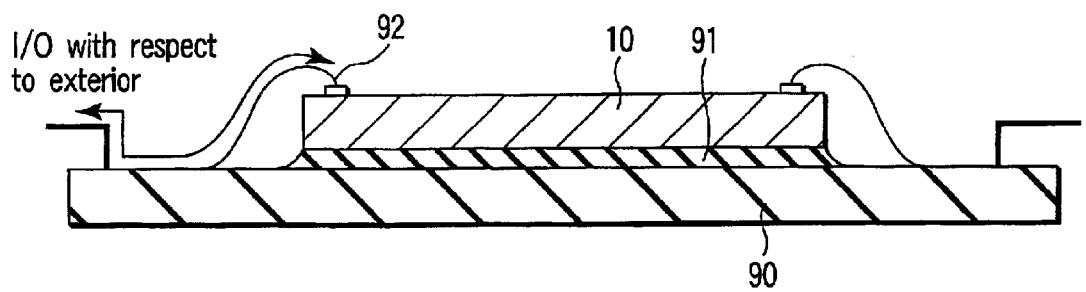
FIG. 42 is a cross sectional view showing a fourth example of a wiring to be corrected in the embodiment of the present invention.

FIG. 42 shows a case wherein the semiconductor chip 10 is mounted on the wiring board 90 by use of bonding wires 92 by a wire bonding method. The bonding wires 92 basically correspond to the wirings 30-1 to 30-$j$, 30-$r$, 31, 32, 33 in the circuit shown in FIGS. 2 and 3 and when poor connection occurs in any one of the wirings 30-1 to 30-$j$, compensation for the poor connection is made by use of the wiring 30-$r$.

With this configuration, it is necessary to provide the connection test control circuit in the semiconductor chip 10 or outside the system. Of course, the connection test control circuit can be provided both in the semiconductor chip and outside the system. Further, since the connection rearrange wiring section is provided only in the semiconductor chip 10, it becomes necessary to make selective connections to the wirings when the wiring board 90 is connected to the external I/O.

With the above configuration, basically, the same operation and effect as those in the above embodiment and the modifications thereof can be attained.

Figure 43:
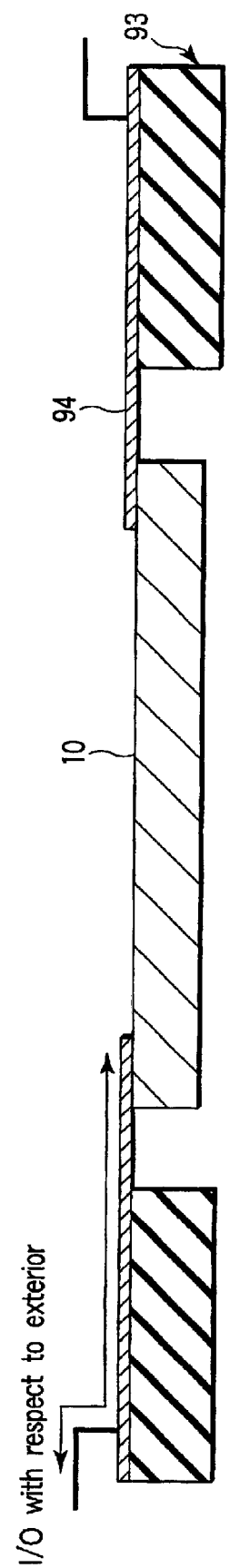
FIG. 43 is a cross sectional view showing a fifth example of a wiring to be corrected in the embodiment of the present invention.

FIG. 43 shows a case wherein the semiconductor chip 10 is mounted on a TAB tape 93 by use of leads 94. The leads 94 basically correspond to the wirings 30-1 to 30-$j$, 30-$r$, 31, 32, 33 in the circuit shown in FIGS. 2 and 3 and when poor connection occurs in any one of the wirings 30-1 to 30-$j$, the poor connection is compensated for by use of the wiring 30-$r$.

With this configuration, it is necessary to provide the connection test control circuit in the semiconductor chip 10 or outside the system. Of course, the connection test control circuit can be provided both in the semiconductor chip and outside the system. Further, since the connection rearrange wiring section is provided only in the semiconductor chip 10, it becomes necessary to make selective connections to the wirings when the wiring board 90 is connected to the external I/O.

With the above configuration, basically, the same operation and effect as those in the above embodiment and the modifications thereof can be attained.

Of course, it is possible to use a combination of the bumps, bonding wires, TAB tape and metal plugs for mounting.

(Fifth Modification)

In the embodiment and the modifications thereof described above, when the child chip is mounted on the parent chip, the connection test circuit in one of the chips may be modified into a circuit having function of writing a value into the other circuit, function of receiving a value from the other circuit, and function of comparing the written value and the received value and holding the comparison result and the connection test circuit in the other chip may be modified into a circuit having function of receiving a value and function of sending the received value back to the other circuit.

With the above configuration, common connection rearrange information can be held in a plurality of chips by sending the result of the final connection test to the other circuit from the circuit which has compared the test results at the end of the connection test. Therefore, since comparison of the results of the connection test can be made in the connection test circuit, the connection test can be made at higher speed in comparison with the embodiment in which data items are read out via the scan paths and compared with each other.

(Sixth Modification)

In the embodiment and the modifications thereof described above, the test data generating circuit can be provided for each wiring.

Further, as the test data generating circuit, a ROM is used and test data written into the ROM can be read out and used.

If the test data generating circuit can be provided for each wiring and the ROM is used, the connection test can be made at higher speed in comparison with the embodiment in which data item is read out by use of the scan path.

(First Semiconductor System Manufacturing Method)

Next, a manufacturing method of the semiconductor system described above is schematically explained. In this case, a manufacturing method of the semiconductor system in which the child chip 20 is mounted on the parent chip 10 by the flip chip interconnection method is explained. First, semiconductor elements are formed in a wafer by a known semiconductor device manufacturing process. Then, the wafer is diced along dicing lines or chip dividing lines into a discrete form and a plurality of semiconductor chips, for example, parent chips 10 are formed. Likewise, child chips 20 are formed. In the parent chip 10, portions 12A-1 to 12A-n of blocks 12-1 to 12-n which configure a connection rearrange wiring section 12, external I/O terminal 13 and connection test control circuit 14 are formed in addition to the main circuit 11. Further, in the child chip 20, the remaining portions 12B-1 to 12B-n of blocks which correspond to the portions 12A-1 to 12A-n of the blocks of the parent chip 10 are formed in addition to the main circuit 21.

Next, the element forming surface of the parent chip 10 and the element forming surface of the child chip 20 are arranged with bumps disposed therebetween and the child chip 20 is mounted on the parent chip 10 by the flip chip interconnection method. At this time, as the bumps, a first group of bumps used to electrically connect the parent chip 10 and the child chip 20 and a second group of bumps for redundancy are used.

Then, the connection test is made to determine whether or not the first group of wirings attain the required function. If poor connection is detected in the wiring of the first group by the connection test, the wiring of the first group in which the poor connection occurs is replaced by the wiring of the second group to rearrange the connection between the parent chip 10 and the child chip 20.

With the above manufacturing method, a semiconductor system which is conventionally dealt with as a fail due to poor connection of the bump occurring at the time of mounting even if both of the parent chip 10 and the child chip 20 are non-defective articles can be relieved. Therefore, the manufacturing yield of the semiconductor system can be enhanced.

When the wire bonding method is used instead of the flip chip interconnection method, basically, the above effect can be attained.

Further, the connection test which is made to determine whether or not the first group of wirings attain the required function can be performed by control of the connection test control circuit provided in the semiconductor chip, but it can also be performed by control of a connection test control device (connection test control circuit) provided outside the semiconductor chip. Further, the connection test can be performed by use of both of the connection test control circuit provided in the semiconductor chip and the connection test control device provided outside the semiconductor chip.

In addition, rearrangement of the connection between the parent chip 10 and the child chip 20 is performed by using the same test results for the parent chip 10 and the child chip 20.

(Second Semiconductor System Manufacturing Method)

Next, a manufacturing method of the semiconductor system in which the semiconductor chip is mounted on the wiring board by a flip chip interconnection method is explained. First, semiconductor elements are formed in a wafer by a known semiconductor device manufacturing process. Then, the wafer is diced along dicing lines or chip dividing lines into a discrete form and a plurality of semiconductor chips are formed. In the semiconductor chip, blocks 12-1 to 12-n of a connection rearrange wiring section 12 and connection test control circuit 14 are formed in addition to the main circuit 11.

Next, the wiring board and the element forming surface of the semiconductor chip are arranged with bumps disposed therebetween and the semiconductor chip is mounted on the wiring board by the flip chip interconnection method. At this time, as the bumps, a first group of bumps used to electrically connect the semiconductor chip and the wiring board and a second group of bumps for redundancy are used.

Then, the connection test is made to determine whether or not the first group of wirings attain the required function. If poor connection is detected in the wiring of the first group by the connection test, the wiring of the first group in which the poor connection occurs is replaced by the wiring of the second group to rearrange the connection between the semiconductor chip and the wiring board.

With the above manufacturing method, a semiconductor system which is conventionally dealt with as a fail due to poor connection of the bump occurring at the time of mounting even if the semiconductor chip is a non-defective article can be relieved. Therefore, the manufacturing yield of the semiconductor system can be enhanced.

When the wire bonding method is used instead of the flip chip interconnection method, basically, the same effect can be attained.

Further, the connection test which is made to determine whether or not the first group of wirings attain the required function can be performed by control of the connection test control circuit provided in the semiconductor chip, but it can also be performed by control of a connection test control device (connection test control circuit) provided outside the semiconductor chip. Further, the connection test can be performed by use of both of the connection test control circuit provided in the semiconductor chip and the connection test control device provided outside the semiconductor chip.

(Third Semiconductor System Manufacturing Method)

Next, a manufacturing method of the semiconductor system in which the semiconductor chip is mounted on the TAB tape is explained. First, semiconductor elements are formed in a wafer by a known semiconductor device manufacturing process. Then, the wafer is diced along dicing lines or chip dividing lines into a discrete form and a plurality of semiconductor chips are formed. In the semiconductor chip, blocks 12-1 to 12-n of the connection rearrange wiring section 12 and connection test control circuit 14 are formed in addition to the main circuit 11.

Next, the semiconductor chip is arranged in a device hole of the TAB tape, the front end portions of leads are aligned with corresponding pads of the semiconductor chip and then the semiconductor chip is mounted on the TAB tape by subjecting the same to the pressurizing process and heat treatment by use of a bonding tool. At this time, as the leads of the TAB tape, a first group of leads used to lead out the electrodes of the semiconductor chip to the exterior and a second group of leads for redundancy are used.

Then, the connection test is made to determine whether or not the first group of wirings attain the required function. If poor connection is detected in the wiring of the first group by the connection test, the wiring of the first group in which the poor connection occurs is replaced by the wiring of the second group to rearrange the connection between the TAB tape and the semiconductor chip.

Further, the connection test which is made to determine whether or not the first group of wirings attain the required function can be performed by control of the connection test control circuit provided in the semiconductor chip, but it can also be performed by control of a connection test control device (connection test control circuit) provided outside the semiconductor chip. Further, the connection test can be performed by use of both of the connection test control circuit provided in the semiconductor chip and the connection test control device provided outside the semiconductor chip.

With the above manufacturing method, a semiconductor system which is conventionally dealt with as a fail due to poor connection occurring at the time of mounting even if the semiconductor chip is a non-defective article can be relieved. Therefore, the manufacturing yield of the semiconductor system can be enhanced.

As described above, according to one aspect of the present invention, a semiconductor system in which the rate of occurrence of fails can be lowered can be attained.

Also, a connection test method for the semiconductor system by which pass/fail of the connection can be determined by the system itself can be attained.

Further, a semiconductor system manufacturing method in which the rate of occurrence of fails can be lowered and the manufacturing yield can be enhanced can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor system comprising:
   a plurality of semiconductor chips,
   a first group of wirings which interconnect said plurality of semiconductor chips,
   a second group of wirings for redundancy which interconnect said plurality of semiconductor chips,
   a connection rearrange wiring section including a connection test circuit which makes a test for connection between said plurality of semiconductor chips by said first group of wirings and a connection rearrange circuit which makes unusable the wiring of said first group in which poor connection occurs and rearranges the connection between said semiconductor chips by use of the wiring of said second group when the poor connection is detected in the wiring of said first group by said connection test circuit, and
   a connection test control circuit which controls the rearrangement of connection between said plurality of semiconductor chips by said connection rearrange wiring section, said connection test control circuit including a test data generating circuit which generates test data and a coincidence determination circuit which makes a connection test by use of test data formed by said test data generating circuit to determine whether poor connection occurs or not.

2. The semiconductor system according to claim 1, wherein said connection test control circuit is provided in at least one of said plurality of semiconductor chips.

3. The semiconductor system according to claim 1, wherein said connection test control circuit is provided outside said plurality of semiconductor chips.

4. The semiconductor system according to claim 1, wherein said connection test control circuit is provided in at least one of said plurality of semiconductor chips and outside said semiconductor chips.

5. The semiconductor system according to claim 1, wherein said connection rearrange circuit makes unusable the wiring of said first group in which a fail occurs based on the test result by said connection test circuit, switches the connection to sequentially use the adjacent wirings of said first group and rearranges the connection by use of the wiring of said second group.

6. The semiconductor system according to claim 1, wherein said first group of wirings and said second group of wirings each include at least one of a bump, bonding wire, lead of a TAB tape and metal plug.

7. A semiconductor system comprising:
   a plurality of semiconductor chips,
   a first group of wirings which interconnect said plurality of semiconductor chips,
   a second group of wirings for redundancy which interconnect said plurality of semiconductor chips, and
   a connection rearrange wiring section including a connection test circuit which makes a test for connection between said plurality of semiconductor chips by said first group of wirings and a connection rearrange circuit which makes unusable the wiring of said first group in which poor connection occurs and rearranges the connection between said semiconductor chips by use of the wiring of said second group when the poor connection is detected in the wiring of said first group by said connection test circuit, wherein said connection test circuit includes a test data storage element which stores test data and a test result storage element which stores a test result, connection tests are made for said first group of wirings by use of the test data stored in said test data storage element and the test results are stored in said test result storage element.

8. A semiconductor system comprising:
   at least one semiconductor chip,
   a wiring board which includes a first group of wirings electrically connected to said semiconductor chip and a second group of wirings for redundancy electrically connected to said semiconductor chip and on which said at least one semiconductor chip is mounted, and
   a connection rearrange wiring section including a connection test circuit which makes a test for connection between said at least one semiconductor chip and said wiring board and a connection rearrange circuit which makes unusable a wiring of said first group in which poor connection occurs and rearranges the connection between said semiconductor chip and said wiring board by use of the wiring of said second group when the poor connection is detected in the wiring of said first group by said connection test circuit.

9. The semiconductor system according to claim 8, further comprising a connection test control circuit which controls the rearrangement of connection between said at least one semiconductor chip and said wiring board by said connection rearrange wiring section.

10. The semiconductor system according to claim 9, wherein said connection test control circuit is provided in said at least one semiconductor chip.

11. The semiconductor system according to claim 9, wherein said connection test control circuit is provided outside said at least one semiconductor chip.

12. The semiconductor system according to claim 9, wherein said connection test control circuit is provided in said at least one semiconductor chip and outside said at least one semiconductor chip.

13. The semiconductor system according to claim 9, wherein said connection test control circuit includes a test data generating circuit which generates test data and a coincidence determination circuit which makes a connection test by use of test data formed by said test data generating circuit to determine whether poor connection occurs or not.

14. The semiconductor system according to claim 8, wherein said connection test control circuit includes a test data storage element which stores test data and a test result storage element which stores a test result, connection tests are made for said first group of wirings by use of the test data stored in said test data storage element and the test results are stored in said test result storage element.

15. The semiconductor system according to claim 8, wherein said connection rearrange circuit makes unusable a wiring of said first group in which poor connection occurs based on the test result by said connection test circuit, switches the connection to sequentially use the adjacent wirings of said first group and rearranges the connection by use of the wiring of said second group.

16. The semiconductor system according to claim 8, wherein said first group of wirings and said second group of wirings each include at least one of a bump, bonding wire and metal plug.

17. A semiconductor system comprising:
at least one semiconductor chip,
a TAB tape which includes a first group of leads electrically connected to said semiconductor chip and a second group of leads for redundancy electrically connected to said semiconductor chip and on which said at least one semiconductor chip is mounted, and
a connection rearrange wiring section including a connection test circuit which makes a test for connection between said at least one semiconductor chip and said TAB tape and a connection rearrange circuit which makes unusable a lead of said first group in which poor connection occurs and rearranges the connection between said semiconductor chip and said TAB tape by use of the lead of said second group when poor connection is detected in the lead of said first group by said connection test circuit.

18. The semiconductor system according to claim 17, further comprising a connection test control circuit which controls the rearrangement of connection between said at least one semiconductor chip and said TAB tape by said connection rearrange wiring section.

19. The semiconductor system according to claim 18, wherein said connection test control circuit is provided in said at least one semiconductor chip.

20. The semiconductor system according to claim 18, wherein said connection test control circuit is provided outside said at least one semiconductor chip.

21. The semiconductor system according to claim 18, wherein said connection test control circuit is provided in said at least one semiconductor chip and outside said at least one semiconductor chip.

22. The semiconductor system according to claim 18, wherein said connection test control circuit includes a test data generating circuit which generates test data and a coincidence determination circuit which makes a connection test by use of test data formed by said test data generating circuit to determine whether poor connection occurs or not.

23. The semiconductor system according to claim 17, wherein said connection test control circuit includes a test data storage element which stores test data and a test result storage element which stores a test result, connection tests are made for said first group of leads by use of the test data stored in said test data storage element and the test results are stored in said test result storage element.

24. The semiconductor system according to claim 17, wherein said connection rearrange circuit makes unusable a lead of said first group in which poor connection occurs based on the test result by said connection test circuit, switches the connection to sequentially use the adjacent leads of said first group and rearranges the connection by use of the lead of said second group.

25. A connection test method which is used for a semiconductor system in which a plurality of semiconductor chips are interconnected via wirings, the plurality of semiconductor chips including a connection rearrange wiring section configured by a plurality of blocks each including a connection test circuit and connection rearrange circuit, and a connection test control circuit including a test data generating circuit which generates test data and a coincidence determination circuit which detects whether or not poor connection occurs, and the connection test circuit including a test data storage element which stores test data and a test result storage element which stores the test result and making a connection test for the wirings at the time of boot by control of the connection test control circuit, comprising:
initializing the test result storage elements in the connection test circuits,
generating test data by use of the test data generating circuit, writing the test data into the test data storage elements connected via scan paths,
transferring and writing test data between the test data storage elements of the plurality of semiconductor chips via the wirings between the semiconductor chips,
sequentially reading out values of the test data storage elements provided in the blocks of the plurality of semiconductor chips via the scan paths and sequentially writing the results of coincidence determination made by the coincidence determination circuit into the test data storage elements,
recording the results of the connection tests stored in the test data storage elements into the test result storage elements of the respective blocks,
repeatedly performing an operation of said recording of the test data to said recording of the test result into the test result storage elements with respect to a required test pattern,
writing values of the test data storage elements into the test result storage elements of the respective blocks, and
transferring the test result written into the test result storage element to the connection test control circuit via the scan path to determine pass/fail of the connection.

26. The connection method for the semiconductor system according to claim 25, wherein connection rearrangement is made with respect to a block and all of the blocks lying in the succeeding stage of said block when the semiconductor system is determined as a non-defective product by said determining of pass/fail of the connection and information indicating a fail is written in the test result storage element in said block.

* * * * *